United States Patent
Ito et al.

(10) Patent No.: US 8,779,406 B2
(45) Date of Patent: Jul. 15, 2014

(54) NONVOLATILE MEMORY ELEMENT AND METHOD FOR MANUFACTURING THE SAME

(71) Applicant: Panasonic Corporation, Osaka (JP)

(72) Inventors: Satoru Ito, Hyogo (JP); Satoru Fujii, Osaka (JP); Shinichi Yoneda, Kyoto (JP); Takumi Mikawa, Shiga (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/006,424

(22) PCT Filed: Jan. 18, 2013

(86) PCT No.: PCT/JP2013/000225
§ 371 (c)(1),
(2), (4) Date: Sep. 20, 2013

(87) PCT Pub. No.: WO2013/111548
PCT Pub. Date: Aug. 1, 2013

(65) Prior Publication Data
US 2014/0021429 A1    Jan. 23, 2014

(30) Foreign Application Priority Data
Jan. 23, 2012 (JP) ................... 2012-010944

(51) Int. Cl.
| H01L 29/02 | (2006.01) |
| H01L 47/00 | (2006.01) |
| G11C 11/00 | (2006.01) |
| G11C 13/00 | (2006.01) |
| H01L 45/00 | (2006.01) |

(52) U.S. Cl.
CPC ........ *G11C 13/0007* (2013.01); *G11C 2213/32* (2013.01); *H01L 45/146* (2013.01)

USPC ............. 257/2; 257/537; 438/104; 438/382; 365/148

(58) Field of Classification Search
None
See application file for complete search history.

(56) References Cited

U.S. PATENT DOCUMENTS

| 8,022,502 B2 | 9/2011 | Kanzawa et al. |
| 8,445,319 B2 | 5/2013 | Kanzawa et al. |

(Continued)

FOREIGN PATENT DOCUMENTS

| JP | 2010-251352 | 11/2010 |
| WO | 2008/149484 | 12/2008 |

(Continued)

OTHER PUBLICATIONS

International Search Report issued Mar. 26, 2013 in International Application No. PCT/JP2013/000225.

*Primary Examiner* — Andres Munoz
(74) *Attorney, Agent, or Firm* — Wenderoth, Lind & Ponack, LLP

(57) ABSTRACT

A nonvolatile memory element includes a first electrode, a second electrode, and a variable resistance layer positioned between the first electrode and the second electrode. The variable resistance layer has a resistance state which reversibly changes based on an electrical signal applied between the first electrode and the second electrode. The variable resistance layer includes a first variable resistance layer having a first metal oxide and a second variable resistance layer having a second metal oxide. The second variable resistance layer includes a metal-metal bonding region including a metal bond of metal atoms included in the second metal oxide, and the second metal oxide has a low degree of oxygen deficiency and a high resistance value compared to the first metal oxide.

11 Claims, 14 Drawing Sheets

(56) References Cited

U.S. PATENT DOCUMENTS

| | | |
|---|---|---|
| 2009/0283736 A1 | 11/2009 | Kanzawa et al. |
| 2010/0308298 A1* | 12/2010 | Ninomiya et al. .............. 257/5 |
| 2011/0294259 A1 | 12/2011 | Kanzawa et al. |
| 2012/0112153 A1* | 5/2012 | Ninomiya et al. .............. 257/2 |
| 2013/0010530 A1 | 1/2013 | Katayama et al. |
| 2013/0178042 A1 | 7/2013 | Ninomiya et al. |

FOREIGN PATENT DOCUMENTS

| | | |
|---|---|---|
| WO | 2011/118185 | 9/2011 |
| WO | 2012/105214 | 8/2012 |

* cited by examiner

NONVOLATILE MEMORY ELEMENT AND METHOD FOR MANUFACTURING THE SAME

TECHNICAL FIELD

The present invention relates to a variable resistance nonvolatile memory element having a resistance state that changes in response to application of a voltage pulse, and a method for manufacturing the variable resistance nonvolatile memory element.

BACKGROUND ART

Recent years have seen increased high performance in electronic devices such as mobile information devices and information appliances following the development of digital technology. As such, there is an increasing demand for higher-capacity, reduced power consumption, such as reduction in writing power consumption, increased speed during writing and reading, extended operational life, or the like of nonvolatile memory elements. In response to such a demand, it is said that there is a limit on the miniaturization of existing flash memories using floating gates. On the other hand, a nonvolatile memory element (a variable resistance element) that uses a variable resistance material as a material of a memory unit can have a simple structure. Thus, further miniaturization, increase in speed, and reduction of power consumption are expected, and the research and development is advancing (e.g., see PTL 1).

Here, a variable resistance element refers to an element which has characteristics that the resistance state reversibly changes in response to application of a voltage pulse, and can store information in a nonvolatile manner by associating resistance states to correspond to information More specifically, the variable resistance element has a simple structure which includes, between a first electrode layer and a second electrode layer, a variable resistance layer comprising a resistance change material. For example, in the case of a bipolar type variable resistance element, a resistance change phenomenon occurs in the variable resistance layer when voltage pulses having different polarities are applied between the first electrode layer and the second electrode layer (between the electrodes). Specifically, for example, when a negative voltage pulse is applied between the electrodes, the state of the variable resistance layer achieves a low resistance state. Conversely, when a positive voltage pulse is applied between the electrodes, the state of the variable resistance layer achieves a high resistance state. Such a variable resistance element can store two values, for example, by assigning "0" to one of a low resistance state and a high resistance state and assigning "1" to the other. The nonvolatile memory device using a variable resistance element is a memory device which makes use of a variable resistance layer that changes to at least two states, namely, a high resistance state and a low resistance state. The memory device performs, on each of the variable resistance elements, writing and reading of information according to the resistance state.

As a technique regarding a variable resistance element, for example, a variable resistance element in which two tantalum oxide layers having different oxygen content atomic percentages are stacked and used as a variable resistance layer is disclosed (see patent literature (PTL) 1, for example). Note that, after the manufacturing of the variable resistance element, a breakdown voltage is applied once in an initial stage, in order to allow the layer that include the two tantalum oxide layers, which have different oxygen content atomic percentages and are stacked, to function as a variable resistance layer. A voltage value of the breakdown voltage is, generally, a value larger than a voltage value of a voltage pulse which is applied in a normal operation to cause a change in a resistance state of the variable resistance layer.

CITATION LIST

Patent Literature

[PTL 1]
International Publication No. 2008/149484

SUMMARY OF INVENTION

Technical Problem

Further reduction in the breakdown voltage applied to the variable resistance element is desired to satisfy the request for further reduction in power consumption of the nonvolatile memory device.

In view of this, the present invention has an object of reducing a breakdown voltage than before which is applied to the nonvolatile memory element using, as a variable resistance layer, metal oxide layers that are stacked and have different degrees of oxygen deficiency.

Solution to Problem

In order to solve the aforementioned problem, a nonvolatile memory element according to an aspect of the present invention includes: a first electrode; a second electrode; and a variable resistance layer which is positioned between the first electrode and the second electrode, the variable resistance layer having a resistance state which reversibly changes based on an electrical signal applied between the first electrode and the second electrode, wherein the variable resistance layer includes a first variable resistance layer comprising a first metal oxide and a second variable resistance layer comprising a second metal oxide, and the second variable resistance layer includes a metal-metal bonding region including a metal bond of metal atoms included in the second metal oxide, the second metal oxide having a low degree of oxygen deficiency and a high resistance value compared to the first metal oxide.

Furthermore, a method for manufacturing a nonvolatile memory element according to an aspect of the present invention includes: forming a first electrode layer; forming, on the first electrode layer, a first variable resistance layer comprising a first metal oxide; forming, on the first variable resistance layer, a second variable resistance layer which comprises a second metal oxide having a low degree of oxygen deficiency and a high resistance value compared to the first metal oxide; forming, in the second variable resistance layer, a metal-metal bonding region including a metal bond of metal atoms included in the second metal oxide; and forming a second electrode layer on the second variable resistance layer.

Advantageous Effects of Invention

The above-described nonvolatile memory element can reduce a breakdown voltage than before in a nonvolatile memory element in which metal oxide layers having different degrees of oxygen deficiency are stacked and used as a variable resistance layer.

DESCRIPTION OF EMBODIMENTS

First, terms used in embodiments are described.

An "oxygen content atomic percentage" is represented by the percentage of the number of oxygen atoms with respect to the total number of atoms included in a metal oxide. Furthermore, "degree of oxygen deficiency" refers to the ratio of deficient oxygen in a metal oxide relative to the amount of oxygen included in the oxide having its stoichiometric composition.

Here, the "oxygen-deficient metal oxide" is a metal oxide whose oxygen content (atom ratio: ratio of number of oxygen atoms to total number of atoms) is less than a metal oxide having a stoichiometric composition.

More specifically, when the metal is tantalum (Ta), the composition of an oxide of a metal oxide having a stoichiometric composition is $Ta_2O_5$, and thus can be denoted as $TaO_2$. The degree of oxygen deficiency of $TaO_{2.5}$ is 0%. For example, the degree of oxygen deficiency of the oxygen-deficient tantalum oxide having a composition of $TaO_{1.5}$ becomes: degree of oxygen deficiency=$(2.5-1.5)/2.5=40\%$. Furthermore, a metal oxide having excess oxygen has a degree of oxygen deficiency with a negative value. It should be noted that in this Description, unless stated otherwise, the degree of oxygen deficiency includes positive values, 0 (zero), and negative values. Note that, when the metal included in a second metal oxide can take a plurality of stoichiometric compositions as oxides, among the metal oxides, the metal oxide of particular composition having the highest resistance value may be used as a reference for the degree of oxygen deficiency. Furthermore, when the metal included in a first metal oxide can take a plurality of stoichiometric compositions as oxides, among the metal oxides, an oxygen-deficient metal oxide having a lower resistivity than the metal oxide included in the second metal oxide may be used.

Regarding this, the "oxygen content atomic percentage" is, as described above, a percentage of the number of oxygen atoms included in a metal oxide to the total number of atoms included in the metal oxide. The oxygen content atomic percentage of $Ta_2O_5$ is the percentage of the number of oxygen atoms to the total number of atoms that is (O/(Ta+O)) and is thus 71.4 [atm %]. Accordingly, the oxygen-deficient tantalum oxide has an oxygen content atomic percentage that is greater than 0 [atm %] and smaller than 71.4 [atm %]. For example, when the metal included in the first metal oxide and the metal included in the second metal oxide comprise the same constituent metal, the oxygen content atomic percentage corresponds with the degree of oxygen deficiency. More specifically, when the oxygen content atomic percentage of the second metal oxide is greater than the oxygen content atomic percentage of the first metal oxide, the degree of oxygen deficiency of the second metal oxide is smaller than the degree of oxygen deficiency of the first metal oxide.

Next, a conventional nonvolatile memory element is described.

Figure 10:
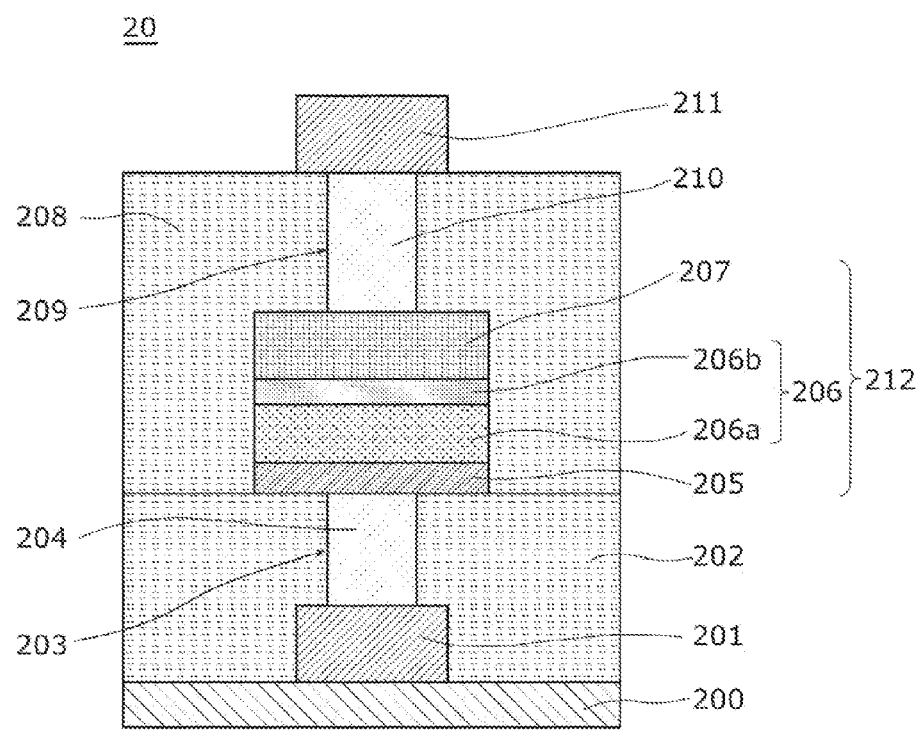
FIG. 10 is a cross-sectional view showing an exemplary schematic configuration of the nonvolatile memory device disclosed in PTL 1.

FIG. 10 is a cross-sectional view showing an example of a schematic configuration of a conventional nonvolatile memory device disclosed in PTL 1.

As shown in FIG. 10, a nonvolatile memory device 20 includes: a substrate 200 on which a first line 201 is formed; a first interlayer dielectric 202 formed to cover the substrate 200 and the first line 201; and a first contact plug 204 embedded in a first contact hole 203 which penetrates through the first interlayer dielectric 202 to reach the first line 201.

The nonvolatile memory device 20 further includes, on the first interlayer dielectric 202, a variable resistance element 212 including (i) a first electrode layer 205 which is formed to cover an exposed surface of the first contact plug 204, (ii) a variable resistance layer 206, and (iii) a second electrode layer 207 that are stacked in the stated order. The first line 201 and the first electrode layer 205 are electrically connected via the first contact plug 204.

The nonvolatile memory device 20 further includes: a second interlayer dielectric 208 which covers the variable resistance element 212; a second contact plug 210 embedded in a second contact hole 209 which penetrates through the second interlayer dielectric 208 to reach the second electrode layer 207 of the variable resistance element 212; and a second line 211 which is formed to cover the upper surface of the second contact plug 210. The second electrode layer 207 and the second line 211 are electrically connected via the second contact plug 210.

The variable resistance layer 206 includes a stacked structure of a first tantalum oxide layer 206a and a second tantalum oxide layer 206b. The second tantalum oxide layer 206b has a higher oxygen content atomic percentage than the first tantalum oxide layer 206a. Here, the material included in the second tantalum oxide layer 206b has, for example, a composition denoted as $TaO_y$ where $2.1 \leq y \leq 2.5$ is satisfied. Furthermore, the material included in the first tantalum oxide layer 206a has, for example, a composition denoted as $TaO_x$ where $0.8 \leq x \leq 1.9$ is satisfied. The second tantalum oxide layer 206b has an oxygen content atomic percentage higher than an oxygen content atomic percentage of the first tantalum oxide layer 206a, and thus the second tantalum oxide layer 206b has the resistivity higher than the resistivity of the first tantalum oxide layer 206a.

(Outline of Nonvolatile Memory Element and its Manufacturing Method)

A nonvolatile memory element according to an aspect of the present invention includes: a first electrode; a second electrode; and a variable resistance layer which is positioned between the first electrode and the second electrode, the variable resistance layer having a resistance state which reversibly changes based on an electrical signal applied between the first electrode and the second electrode, wherein the variable resistance layer includes a first variable resistance layer comprising a first metal oxide and a second variable resistance layer comprising a second metal oxide, and the second variable resistance layer includes a metal-metal bonding region including a metal bond of metal atoms included in the second metal oxide, the second metal oxide having a low degree of oxygen deficiency and a high resistance value compared to the first metal oxide.

In the nonvolatile memory element according to an aspect of the present invention, the metal-metal bonding region including the metal bond is included in a portion of the second metal oxide layer, and the breakdown voltage is thus reduced. More specifically, in the nonvolatile memory element according to the present invention, when a voltage (a breakdown voltage) of a certain, constant level is applied to the variable resistance element, oxygen deficiency is induced in the second variable resistance layer with a metal bond as a base point, and a conductive path which exhibits a metallic conduction due to the oxygen deficiency is formed in the variable resistance layer. Compared to the case of the conventional variable resistance element which does not include the metal bond, the variable resistance element which includes the metal bond is equivalent to the state in which an oxygen deficiency is present in the oxide layer in advance, and thus it becomes possible to form a conductive path at a low voltage, making it possible to achieve a breakdown at a low voltage.

Furthermore, for example, in the variable resistance layer, the metal-metal bonding region may be present at an interface between the second electrode and the second variable resistance layer.

Forming the metal-metal bonding region in the second variable resistance layer at the interface between the second variable resistance layer and the second electrode makes it possible to fix the region in which the change in resistance state occurs in the second variable resistance layer to be near the interface between the second variable resistance layer and the second electrode. With this, the resistance changing operation of the nonvolatile memory element can be performed more stably.

Furthermore, for example, in the variable resistance layer, the metal-metal bonding region may be present in the second variable resistance layer except on a surface of the second variable resistance layer.

Forming the metal-metal bonding region in the second variable resistance layer except on the surface of the second variable resistance layer does not increase the conductive path which reaches the second variable resistance layer from the second electrode, and it is possible to reduce a leakage current other than in the region in which a change in a resistance state occurs in the second variable resistance layer.

Furthermore, for example, each of the first metal oxide, the second metal oxide, and the metal-metal bonding region may comprise a transition metal oxide or an aluminum oxide.

Furthermore, for example, the first metal oxide, the second metal oxide, and the metal-metal bonding region comprise a material including tantalum, hafnium, or zirconium.

Furthermore, for example, the second variable resistance layer may comprise an insulator.

Furthermore, for example, it may be that the metal-metal bonding region is present in the second variable resistance layer near an interface between the second variable resistance layer and the second electrode, and the second variable resistance layer has a degree of oxygen deficiency which gradually increases toward the second electrode.

A method for manufacturing a nonvolatile memory element according to the present invention includes: forming a first electrode layer; forming, on the first electrode layer, a first variable resistance layer comprising a first metal oxide; forming, on the first variable resistance layer, a second variable resistance layer which comprises a second metal oxide having a low degree of oxygen deficiency and a high resistance value compared to the first metal oxide; forming, in the second variable resistance layer, a metal-metal bonding region including a metal bond of metal atoms included in the second metal oxide; and forming a second electrode layer on the second variable resistance layer.

Furthermore, for example, in the forming of a metal-metal bonding region, oxygen may be desorbed from the second variable resistance layer to form the metal-metal bonding region.

Furthermore, for example, in the forming of a second electrode layer, it may be that the second electrode layer is formed by sputtering, and in the forming of a metal-metal bonding region, sputtering is performed using, as a target, a second electrode material included in the second electrode layer, with a film formation pressure lower than a film formation pressure for forming the second electrode layer.

Furthermore, for example, it may be that the forming of a second variable resistance layer includes (i) stacking the second metal oxide after the forming of a first variable resistance layer and (ii) stacking the second metal oxide after the forming of a metal-metal bonding region.

Hereinafter, embodiments of the present invention shall be described in detail with reference to the Drawings. Note that, the dimensions, scale ratios and the like shown in the drawings are not necessarily strictly accurate. Note that, each of the subsequently-described embodiments shows one specific example of embodiments of the present invention. The numerical values, shapes, materials, structural components, the arrangement and connection of the structural components, steps, the processing order of the steps, etc. shown in the following embodiments are mere examples, and therefore do not limit the scope of the present invention. The present invention is defined by CLAIMS. Thus, among the structural components in the following embodiments, structural components not recited in any one of the independent claims indicating the broadest concept of the present invention are described as arbitrary structural components.

First Embodiment

A nonvolatile memory element according to Embodiment 1 and a method for manufacturing the nonvolatile memory element according to Embodiment 1 are described with reference to FIG. 2 to FIG. 7.

(Configuration of Variable Resistance Element)

First, a configuration of the nonvolatile memory element according to this embodiment is described. Here, FIG. 1 is a cross-sectional view showing an exemplary configuration of a nonvolatile memory device 10 including a nonvolatile memory element (a variable resistance element 113) according to this embodiment.

Figure 1:
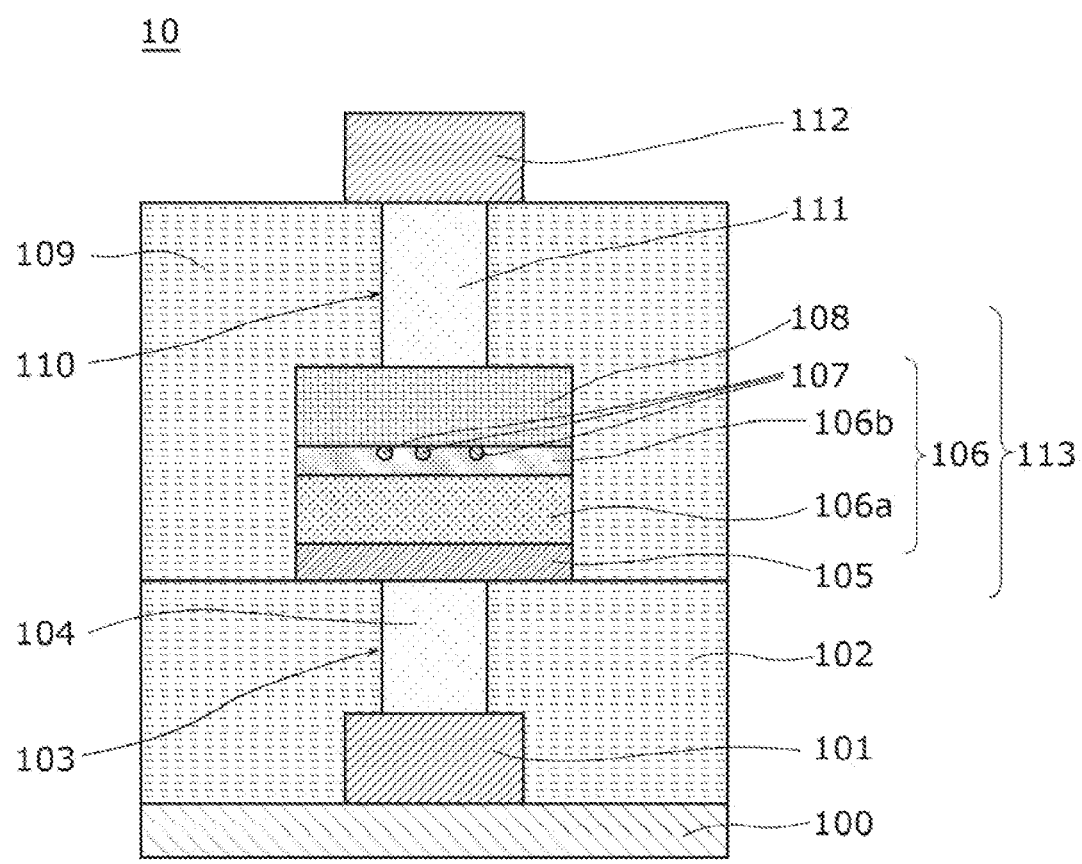
FIG. 1 is a cross-sectional view schematically showing an exemplary configuration of a nonvolatile memory device including a nonvolatile memory element according to Embodiment 1.

As shown in FIG. 1, the nonvolatile memory device 10 includes: a substrate 100, a first line 101, a first interlayer dielectric 102, a first contact plug 104 embedded in a first contact hole 103 which is formed in the first interlayer dielectric 102. The nonvolatile memory device 10 further includes, on the first interlayer dielectric 102, the variable resistance element 113 (corresponds to the nonvolatile memory element according to the present invention) including (i) a first electrode layer 105, (ii) a variable resistance layer 106 in which a first variable resistance layer 106a and a second variable resistance layer 106b are stacked, and (iii) a second electrode layer 108 that are stacked in the stated order. The nonvolatile memory device 10 further includes: a second interlayer dielectric 109 which covers the variable resistance element 113; a second contact plug 111 embedded in a second contact hole 110 which is formed in the second interlayer dielectric 109; and a second line 112 which is formed to cover the upper surface of the second contact plug 111.

Note that, the nonvolatile memory element according to this embodiment includes the variable resistance element 113. In other words, the substrate 100, the first line 101, the first interlayer dielectric 102, the first contact hole 103, the first contact plug 104, the second interlayer dielectric 109, the second contact hole 110, the second contact plug 111, and the second line 112 are described as arbitrary components.

More specifically, the substrate 100 is a silicon substrate in this embodiment. On the substrate 100, in addition to the nonvolatile memory element according to this embodiment, a transistor and so on are formed.

The first line 101 comprises, for example, copper or aluminum and is formed on the substrate 100.

The first interlayer dielectric 102 is configured to cover the substrate 100 and the first line 101. In this embodiment, the first interlayer dielectric 102 includes a silicon oxide film having a thickness of 300 to 500 [nm].

The first contact hole 103 is formed to penetrate through the first interlayer dielectric 102 and to expose the surface of the first line 101. In this embodiment, the first contact hole 103 is formed to have a cylindrical shape with a diameter of 50 to 300 [nm].

In this embodiment, the first contact plug 104 comprises a material which mainly composed of tungsten. The first contact plug 104 is electrically connected to the first line 101 and the first electrode layer 105.

The first electrode layer 105 included in the variable resistance element 113 comprises a first electrode material having a lower standard electrode potential than a second electrode material included in the second electrode layer 108 described later. In this embodiment, the first electrode layer 105 has a film thickness of 5 to 100 [nm]. The higher the standard electrode potential of a material is, the more difficult to oxidize the material is. For example, when materials of the first variable resistance layer 106a and the second variable resistance layer 106b described later include a tantalum oxide, the first electrode material may include a material, such as tantalum nitride (TaN), tungsten (W), nickel (Ni), tantalum (Ta), titanium (Ti), aluminum (Al), tantalum nitride (TaN), and titanium nitride (TIN), having a lower standard electrode potential than a metal included in a first metal oxide.

The variable resistance layer 106 included in the variable resistance element 113 includes: the first variable resistance layer 106a formed on the first electrode layer 105; the second variable resistance layer 106b; and a metal-metal bonding region 107 which is present in the second variable resistance layer 106b.

The first variable resistance layer 106a comprises an oxygen-deficient first metal oxide. In this embodiment, the first variable resistance layer 106a has a film thickness of 5 to 100 [nm]. The first metal oxide may be a transition metal oxide or an aluminum oxide. More specifically, the first metal oxide may comprise a metal oxide comprising at least one metal oxide selected from the group consisting of a transition metal oxide, such as a tantalum oxide, a hafnium oxide, a zirconium oxide, and an aluminum oxide. Hereinafter, in this embodiment, description is given assuming the case in which $TaO_x$ (a tantalum oxide, where x is the number of oxygen (O) atoms when the number of tantalum (Ta) atoms is assumed to be 1) is used as the first metal oxide. Here, x may satisfy: $0.8 \leq x \leq 1.9$. Furthermore, the film thickness of the first variable resistance layer 106a is set appropriately according to manufacturing processing or a film thickness, a shape, or the like of another layer.

The second variable resistance layer 106b comprises a second metal oxide having a low degree of oxygen deficiency and a high resistance value compared to the first metal oxide included in the first variable resistance layer 106a. In this embodiment, the second variable resistance layer 106b has a film thickness of 2 to 10 [nm]. Here, the second metal oxide may include a transition metal oxide or an aluminum oxide. More specifically, the second metal oxide may include a metal oxide comprising at least one metal oxide selected from the group consisting of a tantalum oxide, a hafnium oxide, a zirconium oxide, an aluminum oxide, and the like. The second metal oxide may include an oxide of the same metal as the first metal oxide or may include an oxide of a different metal from the first metal oxide.

Furthermore, for example, in the case where the second metal oxide includes the oxide of the same metal as the first metal oxide, although the second metal oxide includes a metal oxide having a higher oxygen content atomic percentage than the first metal oxide, the oxygen content atomic percentage in such a case is not particularly limited. Stated differently, the second metal oxide may have any degree of oxygen deficiency smaller than the degree of oxygen deficiency of the first metal oxide, such as a degree of oxygen deficiency with which the second metal oxide becomes an insulator. More specifically, the second variable resistance layer 106b may comprise an insulator.

Hereinafter, in this embodiment, description is given assuming the case in which the second metal oxide is $TaO_y$ (a tantalum oxide, where y is the number of O atoms when the number of Ta atoms is assumed to be 1). In this case, as described above, this embodiment assumes that the metal oxide included in the first variable resistance layer 106a is $TaO_x$ (x: the number of O atoms when the number of Ta atoms is assumed to be 1), and thus x<y may be satisfied. In addition, y may satisfy: $2.1 \leq y \leq 2.5$. Furthermore, the film thickness of the second variable resistance layer 106b is set appropriately according to manufacturing processing or a film thickness, a shape, or the like of another layer.

The metal-metal bonding region 107 is a region including a metal-metal bond (i.e., a metal bond) in which metals included in the second metal oxide are bonded, and is formed in the second variable resistance layer 106b at the interface between the second variable resistance layer 106b and the second electrode layer 108. The metal-metal bonding region 107 may be formed to be a layer having the same area as the second variable resistance layer 106b or may be formed on a portion of the surface of the second variable resistance layer 106b. Furthermore, the portion of the surface of the second variable resistance layer 106b may include a plurality of discontinuous regions. More specifically, for example, when the second metal oxide is $TaO_y$ (a tantalum oxide), the metal-metal bonding region 107 is a region including a Ta—Ta bond (an example of a metal-metal bond, in other words, an example of a metal bond). Note that, in this embodiment, the metal-metal bond is formed in the second variable resistance layer 106b. This means that the degree of oxygen deficiency of the second variable resistance layer 106b gradually increases toward the second electrode.

The second electrode layer 108 included in the variable resistance element 113 comprises the second electrode material having a higher standard electrode potential than (i) the metal included in the second metal oxide and (ii) the first electrode material included in the first electrode layer 105. As described above, when tantalum oxides are used as the first metal oxide and the second metal oxide, the second electrode material may include, for example, iridium (Ir), platinum (Pt), palladium (Pd), gold (Au), copper (Cu), silver (Ag), or the like. In other words, when tantalum oxides are used as the first metal oxide and the second metal oxide, relationships $V_{Ta}<V_2$ and $V_1<V_2$ may be satisfied where $V_1$ is the standard electrode potential of the first electrode layer 105, $V_{Ta}$ is the standard electrode potential of tantalum, and $V_2$ is the standard electrode potential of the second electrode layer 108. The above configuration allows an oxidation-reduction reaction to selectively occur in the second variable resistance layer 106b near the interface between the second electrode layer 108 and the second variable resistance layer 106b, which provides a stable resistance change phenomenon. In addition, $V_1<V_{Ta}$ may be satisfied, from the perspective of stable resistance change phenomenon. When a metal oxide other than the tantalum oxide is used, the standard electrode potential of the metal may be used instead of the above-described $V_{Ta}$. Furthermore, in this embodiment, the second electrode layer 108 has a film thickness of 5 to 100 [nm].

The second interlayer dielectric 109 is configured to cover the variable resistance element 113. In this embodiment, the second interlayer dielectric 109 includes a silicon oxide film having a thickness of 300 to 500 [nm].

The second contact hole 110 is formed to penetrate through the second interlayer dielectric 109 and to expose the surface of the second electrode layer 108 which is included in the variable resistance element 113. In this embodiment, the second contact hole 110 is formed to have a cylindrical shape with a diameter of 50 to 300 [nm].

In this embodiment, the second contact plug 111 comprises a material which mainly composed of tungsten. The second contact plug 111 is electrically connected to the second line 112 and the second electrode layer 108.

The second line 112 comprises, for example, copper or aluminum, and is formed on the second interlayer dielectric 109 to cover the second contact plug 111.

(Manufacturing Method)

Next, a method for manufacturing the nonvolatile memory element according to this embodiment is described.

A method for manufacturing the nonvolatile memory element according to this embodiment includes: a process of forming the first electrode layer 105; a process of forming, on the first electrode layer 105, the first variable resistance layer 106a comprising the first metal oxide; a process of forming, on the first variable resistance layer 106a, the second variable resistance layer 106b comprising the second metal oxide having a low degree of oxygen deficiency and high resistance value compared to the first metal oxide; a process of forming, in the second variable resistance layer 106b, the metal-metal bonding region 107 including a metal bond of metal atoms included in the second metal oxide; and a process of forming, on the second variable resistance layer 106b, the second electrode layer 108. Note that, in this embodiment, in the process of forming the metal-metal bonding region 107, oxygen is desorbed from the second variable resistance layer 106b, which is formed in the process of forming the second variable resistance layer 106b, to form the metal-metal bonding region 107.

The following specifically describes a method for manufacturing the nonvolatile memory device 10 which includes a nonvolatile memory element according to the present invention.

Here, each of FIG. 2A to FIG. 2L is a schematic cross-sectional view showing the method for manufacturing the nonvolatile memory device 10 shown in FIG. 1.

Figure 2A:
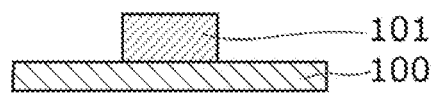
FIG. 2A is a cross-sectional view showing a process of forming a first line on a substrate.

First, as shown in FIG. 2A, the first line 101 is formed on the substrate 100. More specifically, the first line 101 is formed by (i) depositing aluminum, which is an example of a first line material layer, on the silicon substrate 100 to have a thickness of 400 to 600 [nm] by sputtering, and (ii) patterning the first line material layer into a desired shape using a desired mask and a dry etching technique. More specifically, for example, the first line 101 may have a width of 0.25 [nm] and a thickness of 450 [nm].

Figure 2B:
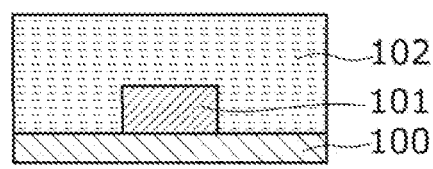
FIG. 2B is a cross-sectional view showing a process of forming a first interlayer dielectric on the substrate to cover the first line.

Subsequently, as shown in FIG. 2B, the first interlayer dielectric 102 is formed on the substrate 100 to cover the first line 101. More specifically, here, the first interlayer dielectric 102 is formed by depositing a silicon oxide film using a CVD method with tetraethyl orthosilicate (TEOS) as a material, and planarizing the silicon oxide film by CMP. Here, the thickness of the first interlayer dielectric 102 is 500 to 1000 [nm]. Furthermore, although the case of using, as a material used with the CVD method, TEOS is described here, the material is not limited to this example. Other than this, as a material of the first interlayer dielectric 102, a low-k material (low dielectric constant material), such as a fluorine-containing oxide (e.g., FSG: fluorinated silicate glass), may be used in order to reduce the amount of parasitic capacitance between lines.

Figure 2C:
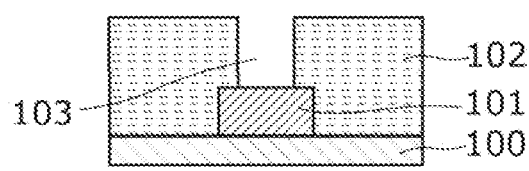
FIG. 2C is a cross-sectional view showing a process of forming a first contact hole to penetrate through the first interlayer dielectric and to expose the first line.

Subsequently, as shown in FIG. 2C, the first contact hole 103 is formed in the first interlayer dielectric 102. More specifically, the first contact hole 103 is formed, for example, by patterning the first interlayer dielectric 102 using a desired mask and a dry etching technique. The first contact hole 103 may have a diameter smaller than the width of the first line 101. Thus, this embodiment assumes the case in which the first contact hole 103 has a diameter of 50 to 300 [nm]. When the first contact hole 103 has a diameter smaller than the width of the first line 101, the contact area between the first line 101 and the first contact plug 104 can be maintained uniform even when misalignment of the mask occurs in patterning. As a result, for example, it is possible to reduce variation in a cell current originating from a difference in the contact area.

Figure 2D:
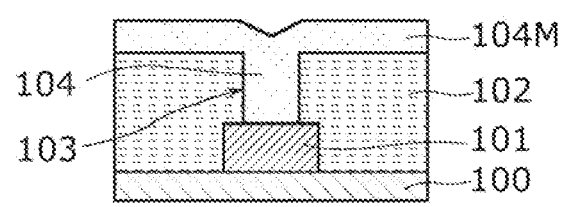
FIG. 2D is a cross-sectional view showing a process of filling the first contact hole with a conductive material.
Figure 2E:
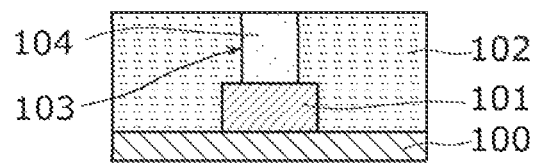
FIG. 2E is a cross-sectional view showing a process of forming the first contact plug by removing a conductive material above the top surface of the first interlayer dielectric.

Subsequently, as shown in FIG. 2D, a conductive material layer 104M is deposited to fill the first contact hole 103. Then, as shown in FIG. 2E, the conductive material layer 104M above the top surface of the first interlayer dielectric 102 is removed, to form the first contact plug 104. In this embodiment, the conductive material layer 104M has a stacked structure of three layers, namely, W/Ti/TiN. More specifically, first, a material including a titanium oxide is deposited to have a thickness of 5 to 30 [nm] by sputtering, to form a titanium nitride layer (TiN layer) which functions as a diffusion barrier. Subsequently, using the CVD method, a material including titanium is deposited to have a thickness of 5 to 30 [nm], to form a titanium layer (Ti layer) which functions as an adhesion layer. Subsequently, using the CVD method, tungsten which becomes a main component of a contact plug is deposited to have a thickness of 200 to 400 nm. Thus, the first contact hole 103 is filled with the conductive material layer 104M having a stacked structure. In addition, the first contact plug 104 is formed, for example, by removing the conductive material layer 104M above the top surface of the first interlayer dielectric 102 by CMP.

Subsequently, the variable resistance element 113 is formed on the first interlayer dielectric 102 to cover the first contact plug 104. The variable resistance element 113 is configured by stacking the first electrode layer 105, the variable resistance layer 106, and the second electrode layer 108.

Figure 2F:
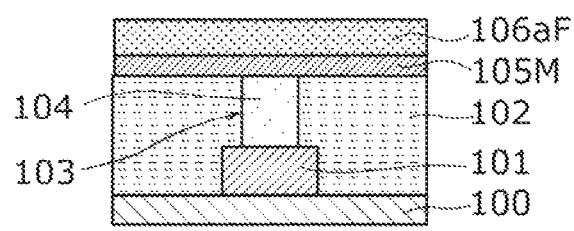
FIG. 2F is a cross-sectional view showing a process of forming a first electrode material layer included in a first electrode layer and a first metal oxide layer included in a first variable resistance layer to cover the first contact plug.
Figure 2G:
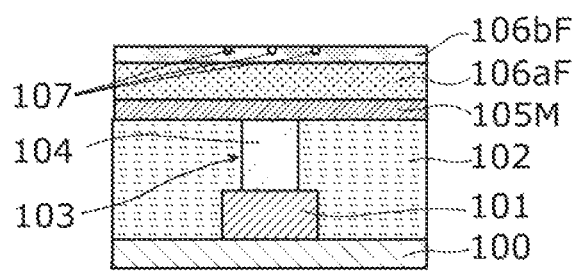
FIG. 2G is a cross-sectional view showing a process of forming, on the upper surface of the first metal oxide layer, a second metal oxide layer included in a second variable resistance layer in Embodiment 1.
Figure 2H:
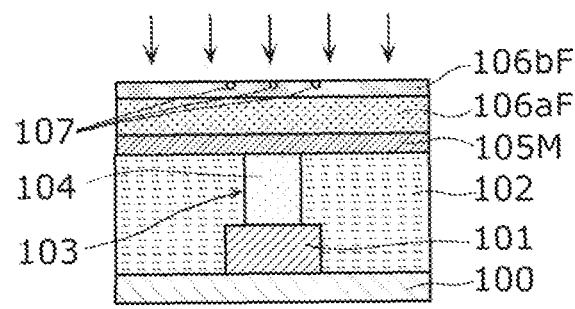
FIG. 2H is a cross-sectional view showing a process of forming, in a portion of the second metal oxide layer, a metal-metal bonding region in Embodiment 1.
Figure 2I:
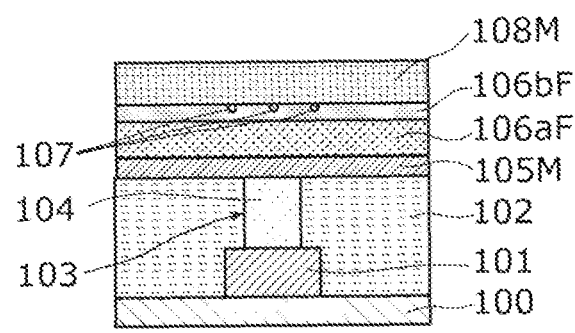
FIG. 2I is a cross-sectional view showing a process of forming, on the first metal oxide layer, a second electrode material layer included in a second electrode layer in Embodiment 1.
Figure 2J:
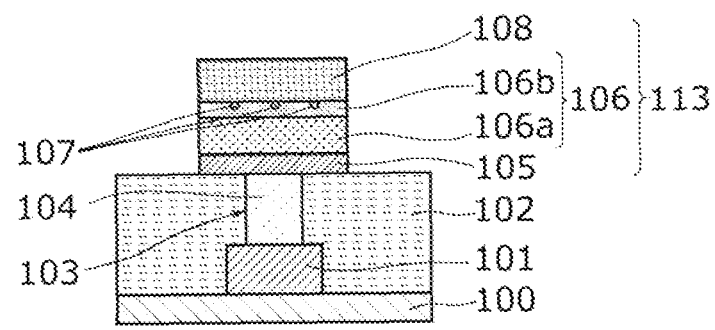
FIG. 2J is a cross-sectional view showing a process of forming the first electrode layer, the first variable resistance layer, the second variable resistance layer, and the second electrode layer by performing patterning on the first electrode material layer, the first metal oxide layer, the second metal oxide layer, and the second electrode material layer in Embodiment 1.

As shown in FIG. 2F, a first electrode material layer 105M included in the first electrode layer 105, and a first metal oxide layer 106aF comprising the first metal oxide included in the first variable resistance layer 106a are formed to cover the first contact plug 104 (corresponding to a process of forming the first electrode layer and a process of forming the first variable resistance layer, together with the process of patterning shown in FIG. 2J).

More specifically, first, by sputtering, for example, tantalum nitride (TaN) is deposited to have a thickness of 20 to 50 [nm] as the first electrode material layer 105M. Note that, although the sputtering is used to describe the method of depositing the first electrode material layer 105M here, a chemical vapor deposition (CVD) method or an atomic layer deposition (ALD) method may be used.

Subsequently, the first metal oxide layer 106aF is formed by reactive sputtering using tantalum as a target in an atmosphere including oxygen. The first metal oxide layer 106aF is configured of, for example, $TaO_x$ ($0.8 \leq x \leq 1.9$). More specifically, conditions for the reactive sputtering are, for example: power source output of 1000 [W]; a film formation pressure of 0.05 [Pa], an argon flow rate of 20 [sccm], an oxygen gas flow rate of 21 [sccm]. Here, the first metal oxide layer 106aF which is formed under the above-described conditions and has a thickness of 50 [nm] is measured using an RBS method. The result shows that the composition (a value of x in $TaO_x$) of the first metal oxide layer 106aF is: x=1.22. In the following, the composition of a $TaO_x$ layer formed under the above-described conditions is denoted as $TaO_{1.22}$. Furthermore, the resistance value of the sample same as the sample used for the composition analysis is measured using a four-terminal measurement technique. The result shows that the resistivity of the first metal oxide layer 106aF is 3 [mΩ·cm]. In addition, the thickness of the first metal oxide layer 106aF may be, for example, 20 to 50 [nm] according to the measurement value obtained by spectroscopic ellipsometry. Note that, although the first metal oxide layer 106aF is formed by reactive sputtering in this embodiment, the CVD method or the ALD method may be used.

Subsequently, as shown in FIG. 2G, the second metal oxide layer 106bF comprising the second metal oxide is deposited on the first metal oxide layer 106aF (corresponding to the process for forming the second variable resistance layer, together with the patterning process shown in FIG. 2J). The second metal oxide layer 106bF is formed, for example, by performing a plasma oxidation process on portion of the surface of the first metal oxide layer 106aF with oxygen plasma. The thickness of the second metal oxide layer 106bF may be, for example, 4 to 7 [nm]. Conditions for the plasma oxidation are, for example, RF power source output of 50 [W], a substrate temperature of 270 [degrees Celsius], an $O_2$ flow rate of 0.3 [SLM]. With the plasma oxidation process under the above-described conditions, the second metal oxide layer 106bF is configured to have a composition close to $Ta_2O_5$ (oxygen content atomic percentage=71.4%) that is an insulator. Note that, the resistivity of the second metal oxide layer 106bF obtained as a result of the plasma oxidation under the above-described conditions is measured with the four-terminal measurement technique, which shows that the resistivity exceeds the measurable upper limit ($10^8$ [Ω/sq.]). Therefore, the resistivity is believed to be at least $5 \times 10^5$ [mΩ·cm] or greater. Note that, although the second metal oxide layer 106bF is formed by performing the plasma oxidation process on the surface of the first metal oxide layer 106aF in this embodiment, thermal oxidation process may be used or it may be configured to deposit the second metal oxide layer 106bF using a sputtering method, a CVD method, or an ALD method.

Subsequently, as shown in FIG. 2H, the metal-metal bonding region 107 is formed on the surface of the second metal oxide layer 106bF (corresponding to the process of forming the metal-metal bonding region). In this embodiment, the second electrode material, which is iridium for example, included in the second electrode layer 108 is driven into the surface of the second metal oxide layer 106bF by sputtering. With this configuration, oxygen on the surface of the second metal oxide layer 106bF is released, resulting in a formation of the metal-metal bonding region 107 on a portion of the surface of the second metal oxide layer 106bF. Conditions for the processing are, for example, RF power source output of 1000 [W], and a film formation pressure of 0.05 [Pa]. As described above, in this embodiment, the oxygen on the surface of the second metal oxide layer 106bF is released to form the metal-metal bonding region 107. Thus, in this embodiment, the degree of oxygen deficiency in the metal-metal bonding region 107 becomes greater as the surface is approached. Thus, in this embodiment, it can be said that degree of oxygen deficiency of the second variable resistance layer 106b gradually increases toward a second electrode.

Subsequently, as shown in FIG. 2I, a second electrode material layer 108M included in the second electrode layer 108 is deposited on the second metal oxide layer 106bF (corresponding to a process of forming the second electrode layer, together with the patterning process shown in FIG. 2J). In this embodiment, the second electrode material layer 108M is formed by depositing iridium (Ir) to have a thickness of 80 [nm] by sputtering. The processing condition is, for example, a film formation pressure of 0.2 [Pa].

Note that, in this embodiment, each of the process of forming the metal-metal bonding region 107 and the process of depositing the second electrode material layer 108M is performed, using a different pressure, by sputtering in which the target is iridium (Ir). In this case, the process of forming the metal-metal bonding region 107 and the process of depositing the second electrode material layer 108M can be executed substantially as the same process just by controlling the condition of the pressure. Therefore, compared to the case of adding a new process that uses a different method, an increase in man-hours can be substantially reduced. Note that, although the sputtering method is used in this embodiment, the CVD method or the ALD method may be used.

Subsequently, as shown in FIG. 2J, the first electrode material layer 105M, the first metal oxide layer 106aF, the second metal oxide layer 106bF, and the second electrode material layer 108M are patterned to form the first electrode layer 105, the first variable resistance layer 106a, the second variable resistance layer 106b, and the second electrode layer 108. The patterning is performed, for example, using a desired mask and a dry etching technique. The variable resistance element 113 is thus formed.

Figure 2K:
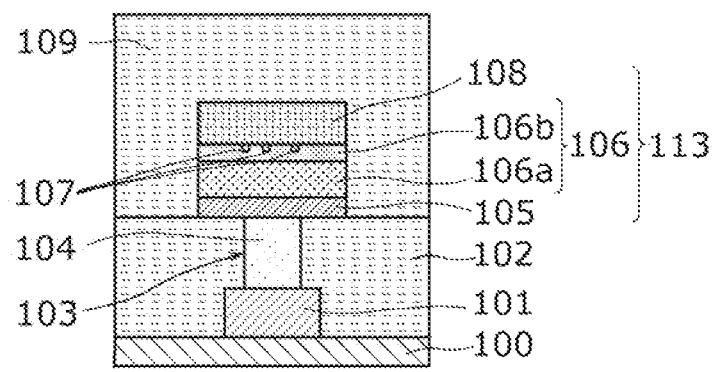
FIG. 2K is a cross-sectional view showing a process of forming a second interlayer dielectric which covers the nonvolatile memory element.

Subsequently, FIG. 2K is a diagram showing a process of forming the second interlayer dielectric 109 to cover the first interlayer dielectric 102 and the variable resistance element 113. In this embodiment, the second interlayer dielectric 109 is formed using the same material and the same method as the first interlayer dielectric 102. In addition, in this embodiment, after the formation of second interlayer dielectric 109, the second interlayer dielectric 109 is, for example, treated with heat for ten minutes in a furnace heated to 400 degrees Celsius, in order to release residual stress on the second interlayer dielectric 109, and remove moisture that remains in the second interlayer dielectric 109.

Figure 2L:
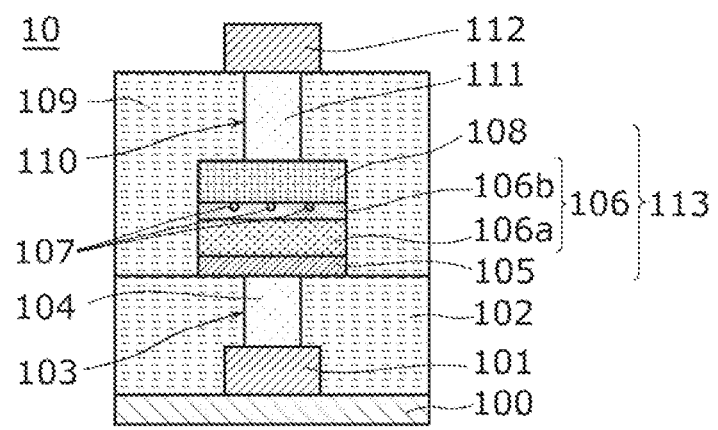
FIG. 2L is a cross-sectional view showing a process of filling, with a second contact plug, the second contact hole formed in the second interlayer dielectric, and forming a second line on the second contact plug.

Subsequently, as shown in FIG. 2L, the second contact hole 110 is formed to penetrate through the second interlayer dielectric 109 and to expose the surface of the second electrode layer 108 of the variable resistance element 113. Then, a material included in the second contact plug 111 is filled in the second contact hole 110 to form the second contact plug 111, and then the second line 112 is formed on the second contact plug 111. In this embodiment, the second contact hole 110 is formed using the same method as the first contact hole 103. Furthermore, in this embodiment, the second contact plug 111 is formed using the same material and the same method as the first contact plug 104. Furthermore, in this embodiment, the second line 112 is formed using the same material and the same method as the first line 101.

Furthermore, in this embodiment, after the second line 112 is formed, the element is, for example, treated with heat for ten minutes in a furnace heated to 400 degrees Celsius, in order to reduce corrosion of aluminum included in the second line.

Note that, although this embodiment describes the case in which each of the layers is stacked and then the variable resistance element 113 is formed by patterning the layers, the method of formation is not limited to this. The variable resistance element 113 may be formed, for example, by sequentially forming the layers in the through-hole formed in the interlayer dielectric. Furthermore, portion of the layers may be formed outside the through-hole, and another portion may be formed in the through-hole.

Furthermore, although this embodiment describes the case in which the first variable resistance layer 106a is in a single layer, the first variable resistance layer 106a may have a stacked structure including a plurality of layers comprising metal oxides having different degrees of oxygen deficiency.

In addition, between the first electrode layer 105 and the first variable resistance layer 106a, a fourth variable resistance layer may be formed comprising a metal oxide having a different oxygen content atomic percentage from the metal oxide included in the first variable resistance layer 106a. Alternatively, for example, between the second variable resistance layer 106b and the second electrode layer 108, a variable resistance layer may be formed comprising a metal oxide having a different oxygen content atomic percentage from the second metal oxide included in the second variable resistance layer 106b. The variable resistance element 113 according to this embodiment may be used as a nonvolatile memory element of a ReRAM or the like.

First Experimental Example

The first experimental example examines oxygen profiles of $TaO_x$ and $Ta_2O_5$ which are variable resistance layers, and how a chemical bonding state of Ta and O changes depending on the film formation condition of iridium that is a second electrode.

First, manufacturing conditions of an experimental target device of which oxygen profile and chemical bonding state of Ta and O are measured are described.

To manufacture the experimental target device, first, $TaO_x$ which corresponds to the first variable resistance layer 106a is deposited on a silicon nitride film to be 50 [nm]. The reaction conditions are power source output of 1000 [W], a film formation pressure of 0.05 [Pa], an argon flow rate of 20 [sccm], and an oxygen gas flow rate of 21 [sccm]. The film thickness of the first variable resistance layer is 50 [nm]. An oxygen content atomic percentage of a tantalum oxide is measured using an RBS method, and observed to be 55[%] (atom ratio). When this tantalum oxide is denoted as $TaO_x$, $x=1.22$.

Next, the first variable resistance layer 106a is treated with oxygen plasma from the intermediate oxide layer side. The conditions for the treatment are an RF power source output of 50 [W], a wafer temperature of 270 [degrees Celsius], and an $O_2$ flow rate of 0.3 [SLM], for 57 seconds. The film thickness of the resulting $Ta_2O_5$ layer which corresponds to the second variable resistance layer 106b is measured using a spectroscopic ellipsometry technique. It is observed that the film thickness of the $Ta_2O_5$ layer of the sample is 5.1 [nm].

Next, iridium which is a second electrode material is deposited by sputtering. Two conditions are set for the sputtering conditions of iridium, that is, (i) "Ir sputtering pressure=0.2 [Pa]" that is a sample obtained with RF power source output of 1000 [W], and a film formation pressure of 0.2 [Pa] and (ii) "Ir sputtering pressure=0.05 [Pa]" that is a sample obtained by decreasing the film formation pressure to 0.05 [Pa] to increase the average free path before reaching the tantalum oxide.

(Analysis on Oxygen Profile and Chemical Bonding State of Ta and O)

For each of two samples, that is, the sample with Ir sputtering pressure=0.2 [Pa] and the sample with Ir sputtering pressure=0.05 [Pa], profiles in the depth directions of tantalum, oxygen, and iridium are analyzed using an auger electron spectroscopy (AES, PHI 700 manufactured by ULVAC-PHI, Inc.).

Figure 3:
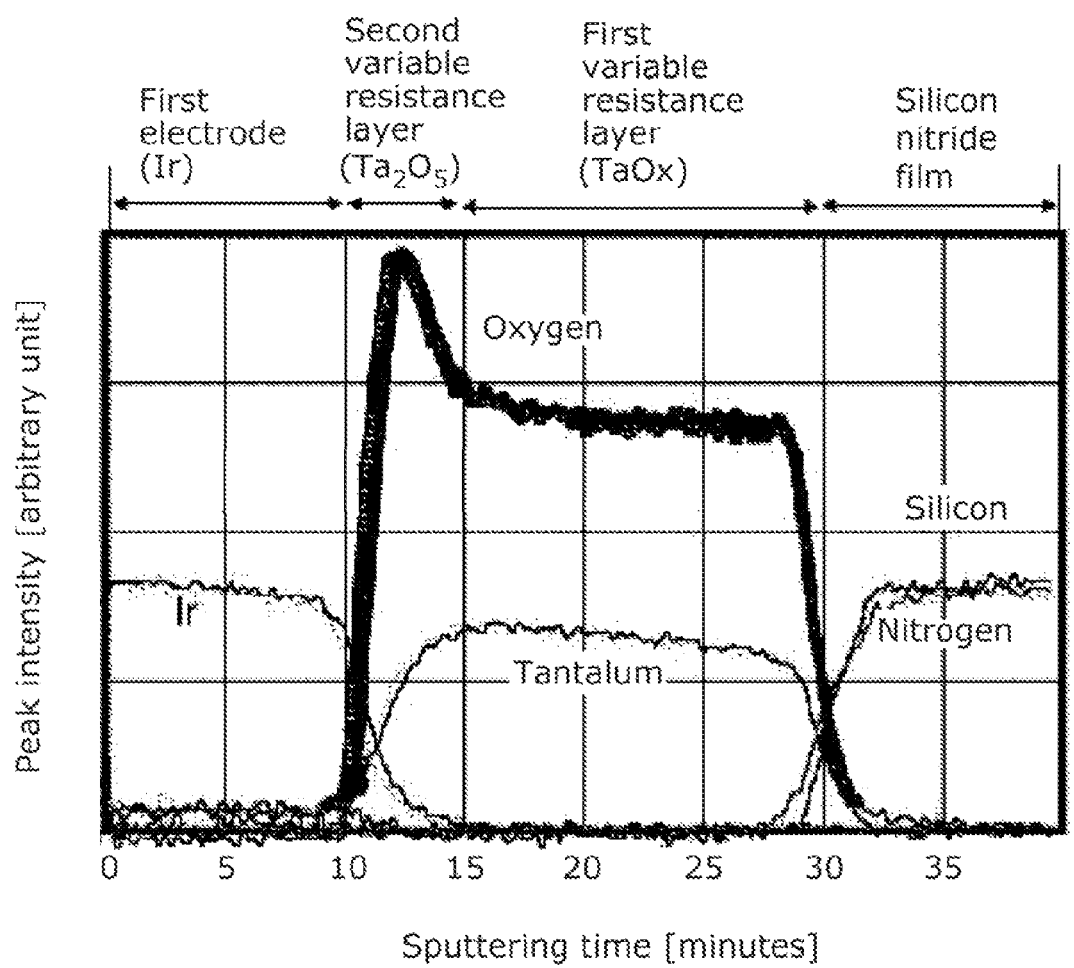
FIG. 3 is a graph showing differences in oxygen profiles of Ir, which is an upper electrode, a $Ta_2O_5$ layer, and a $TaO_x$ layer, between the conventional nonvolatile memory element and the nonvolatile memory element according to Embodiment 1.
Figure 4:
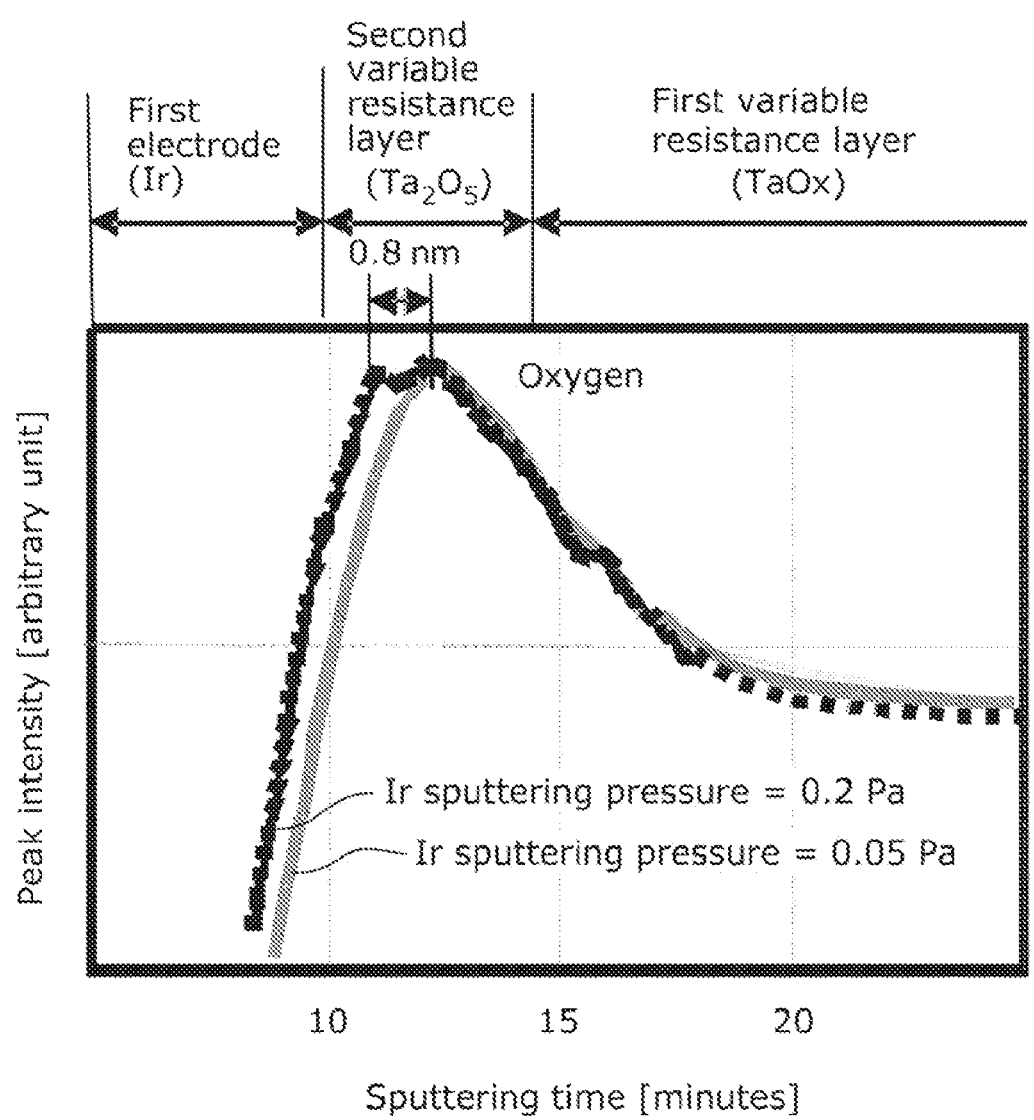
FIG. 4 is an enlarged view of FIG. 3 and showing differences in oxygen profiles near Ir, which is the upper electrode, and the $Ta_2O_5$ layer, between the conventional nonvolatile memory element and the nonvolatile memory element according to Embodiment 1.

Here, FIG. 3 shows analysis on profile of each of the elements in the depth direction of the sample with Ir pressure=0.2 [Pa] and the sample with Ir pressure=0.05 [Pa]. FIG. 4 is an enlarged view of the portion circled with a broken line shown in FIG. 3. The horizontal axis indicates a sputtering time in the AES analytical method, and is equivalent to a distance corresponding to the depth direction of a resistance element. The vertical axis shows peak intensity, and the larger the value is, the higher the density of the element is. A comparison between the sample with Ir pressure=0.2 [Pa] and the sample with Ir pressure 0.05 [Pa] shown in FIG. 4 indicates that, from the interface between the second electrode (iridium) and the second variable resistance layer ($Ta_2O_5$) to the depth of 0.8 [nm], the sample with Ir pressure 0.05 [Pa] has a lower oxygen density.

Figure 5:
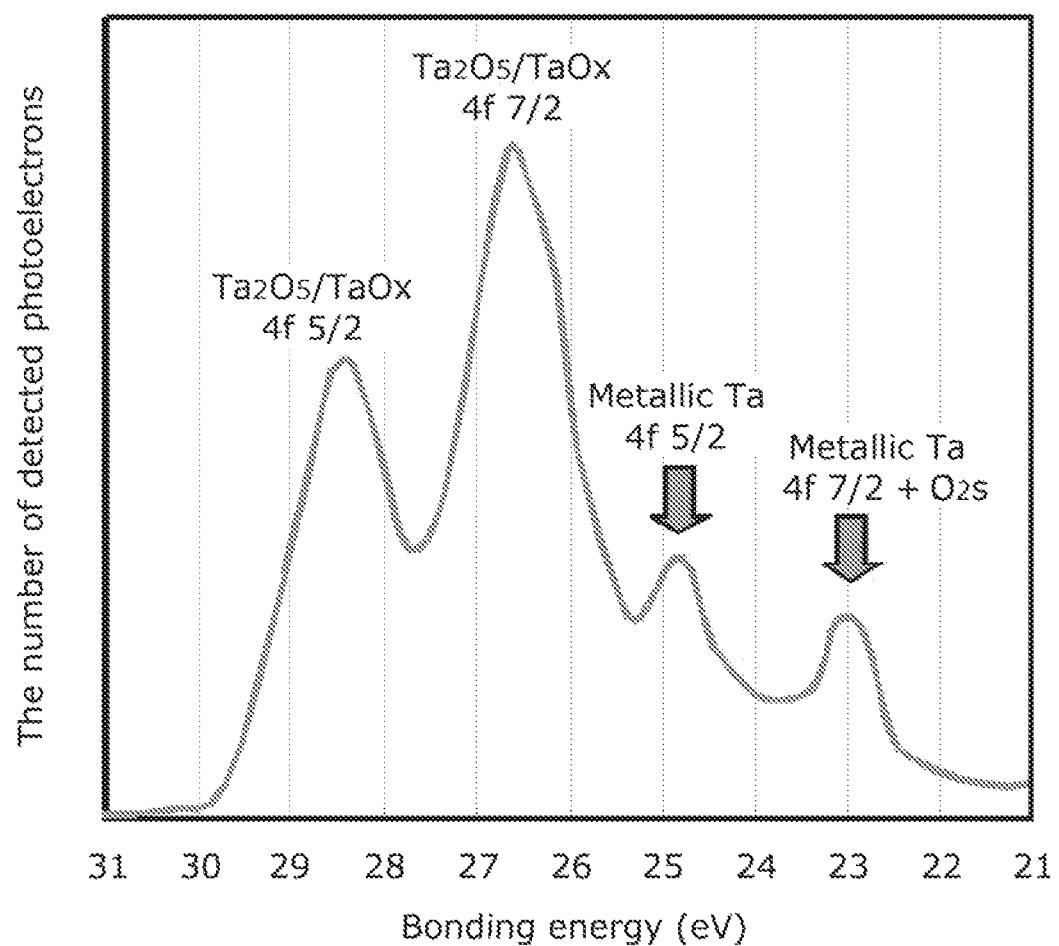
FIG. 5 is a graph showing an energy distribution of bonding on the surface of the $Ta_2O_5$ layer of the nonvolatile memory element according to Embodiment 1.

Furthermore, on the sample with Ir pressure=0.05 [Pa], bonding state of elements are analyzed using an X-ray photoelectron spectroscopy (XPS) method (Quantum2000 manufactured by ULVAC-PHI, Inc.). FIG. 5 shows the results. The horizontal axis indicates a bonding energy [eV] of a photoelectron with respect to an irradiated x-ray, and the vertical axis indicates the number of the detected photoelectrons (strength of photoelectron signal) [arbitrary unit]. In the graph shown in FIG. 5, the two peaks (near 26.7 eV and near 28.4 eV) in the left indicate that photoelectrons are detected due to bonding energy of Ta—O bond, and two peaks (near 23.0 eV and near 24.8 eV) in the right indicated with arrows indicate that photoelectrons are detected due to bonding energy of Ta—Ta bond. The bonding states of elements of the second variable resistance layer ($Ta_2O_5$) and the first variable resistance layer ($TaO_x$) are analyzed in a similar manner using the XPS method, without depositing Ir. In this case, only a Ta—O bond indicating the existence of $Ta_2O_5$ and $TaO_2$ is detected. However, in the case of the sample with Ir pressure=0.05 [Pa], a Ta—Ta bond is detected in addition to Ta—O bond. It becomes apparent that reducing the Ir pressure to 0.05 [Pa] increases the average free path of Ir ion, increasing the energy at the time of reaching $Ta_2O_5$, and thus oxygen desorption from $Ta_2O_5$ occurs, Second Experimental Example In the second experimental example, the settings of the Ir sputtering pressures are 0.2 [Pa] and 0.05 [Pa]. A nonvolatile memory device (experimental target device) is actually manufactured for each of the settings, and the resistance changing operations are verified and the breakdown voltages are compared.

First, the manufacturing conditions of the experimental target devices of which resistance changing operations are verified and the breakdown voltages are compared are described.

To manufacture the experimental target device, first, aluminum is deposited on the silicon substrate by sputtering, and the aluminum is formed into a desired shape by patterning using a mask and a dry etching technique. A first line (thickness 400 to 600 [nm]) is thus formed. The width of the first line here is 0.25 [μm].

Next, a first interlayer dielectric (thickness 500 to 1000 [nm]) is formed using a CVD method with TEOS to cover the first line formed on the substrate. The top surface of the first interlayer dielectric is planarized by CMP.

Next, in the first interlayer dielectric, a first contact hole (260 [nm] in diameter) is formed to expose the upper surface of the first line. In addition, the first contact hole is filled with a conductive material layer having a stacked structure of W/Ti/TiN. A first contact plug is thus formed. The Ti layer is formed to have a thickness of 5 to 30 [nm] by sputtering. The TiN layer is formed to have a thickness of 5 to 30 [nm] using a CVD method. Furthermore, the W layer is formed using a CVD method.

Next, a first electrode layer (400 to 600 [nm] in thickness) is formed to cover the first contact plug.

In addition, on the first electrode layer, a first variable resistance layer comprising a tantalum oxide is formed by performing, using a target comprising tantalum, reactive sputtering in an atmosphere including oxygen. The reaction conditions are power source output of 1000 [W], a film formation pressure of 0.05 [Pa], an argon flow rate of 20 [sccm], and an oxygen gas flow rate of 21 [sccm]. An oxygen content atomic percentage of a tantalum oxide included in the first variable resistance layer is approximately 55% according to the results of the first experimental example. When this tantalum oxide is denoted as $TaO_x$, $x=1.22$.

Subsequently, the first variable resistance layer is treated with oxygen plasma to form a second variable resistance layer. The conditions for the treatment is an RF power source output of 50 [W], a wafer temperature of 270 [degrees Celsius], and an $O_2$ flow rate of 0.3 [SLM], for 57 seconds. The film thickness of the second variable resistance layer is approximately 5.1 [nm] according to the first experimental example.

Next, on the second variable resistance layer, a second electrode (approximately 80 [nm] in thickness) comprising iridium is formed by sputtering. At this time, the sputtering pressure of iridium has two settings, namely, 0.2 [Pa] and 0.05 [Pa] for respective wafers, as with the first experimental example.

Next, separation into individual elements is performed using a mask and a dry etching technique. Each of the elements is 0.38 [μm]×0.38 [μm] in size in a substantially square shape, and 1000 elements are produced.

Next, a second interlayer dielectric (500 to 1000 [nm] in thickness) is formed to cover the entire elements using a CVD method with TEOS. The top surface is planarized by CMP.

Lastly, aluminum is deposited by sputtering, and the aluminum is formed into a desired shape by patterning using a mask and a dry etching technique. A second line (400 to 600 [nm] in thickness) is thus formed. The width of the second line is 0.25 [μm].

(Verification of Resistance Changing Operation and Comparison of Breakdown Voltages)

Figure 6:
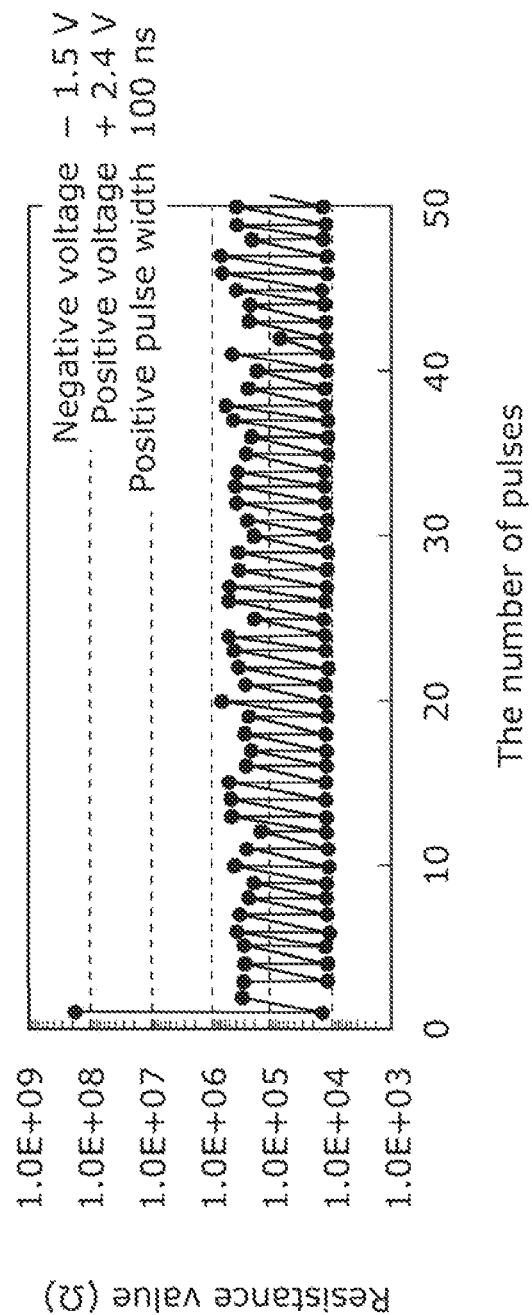
FIG. 6 is a graph showing a resistance change characteristic of the nonvolatile memory element according to Embodiment 1.

FIG. 6 is a diagram showing a resistance change characteristic of a variable resistance element which is formed with a setting of Ir spattering pressure at 0.05 [Pa]. In the experiment, two types of voltage pulses each of which has a different polarity and has a pulse width of 100 [ns] are alternately applied between the first electrode layer and the second electrode layer, and the resistance value is measured after the voltage application. With the alternate application of two types of voltage pulses between the electrodes, the resistance value of the variable resistance layer reversibly changes. More specifically, when the variable resistance layer of the variable resistance element is in a high resistance state, and a negative voltage pulse (voltage of −1.5 [V] and pulse width of 100 [ns]) is applied between the electrodes, the resistance value of the variable resistance layer decreases to approximately 10000[Ω]($10^4$[Ω], a low resistance state). When a positive voltage pulse (voltage of +2.4 [V], and pulse width of 100 [ns]) is applied between the electrodes after the low resistance state is achieved, the resistance value of the variable resistance layer increases to 100000[Ω]($10^5$[Ω], a high resistance state). Note that, the voltage is denoted as a positive voltage when the potential of the second electrode layer is high with respect to the first electrode layer.

The results described above indicates that the variable resistance element shows a resistance changing operation in a stable manner even in the case where the deposition is performed with the Ir sputtering pressure=0.05 [Pa].

Next, a breakdown characteristic of each of the variable resistance element formed with the Ir sputtering pressure=0.2 [Pa] and the variable resistance element formed with the Ir sputtering pressure=0.05 [Pa] is evaluated.

The evaluation is performed by connecting a load resistor of 5 [kΩ] in series to each of the variable resistance elements right after the manufacturing with Ir sputtering pressure=0.2 [Pa] and with the Ir sputtering pressure 0.05 [Pa], locally short circuiting a portion of the second variable resistance layer 106b, and measuring, as the breakdown voltage, a threshold voltage with which the resistance change is started.

Figure 7:
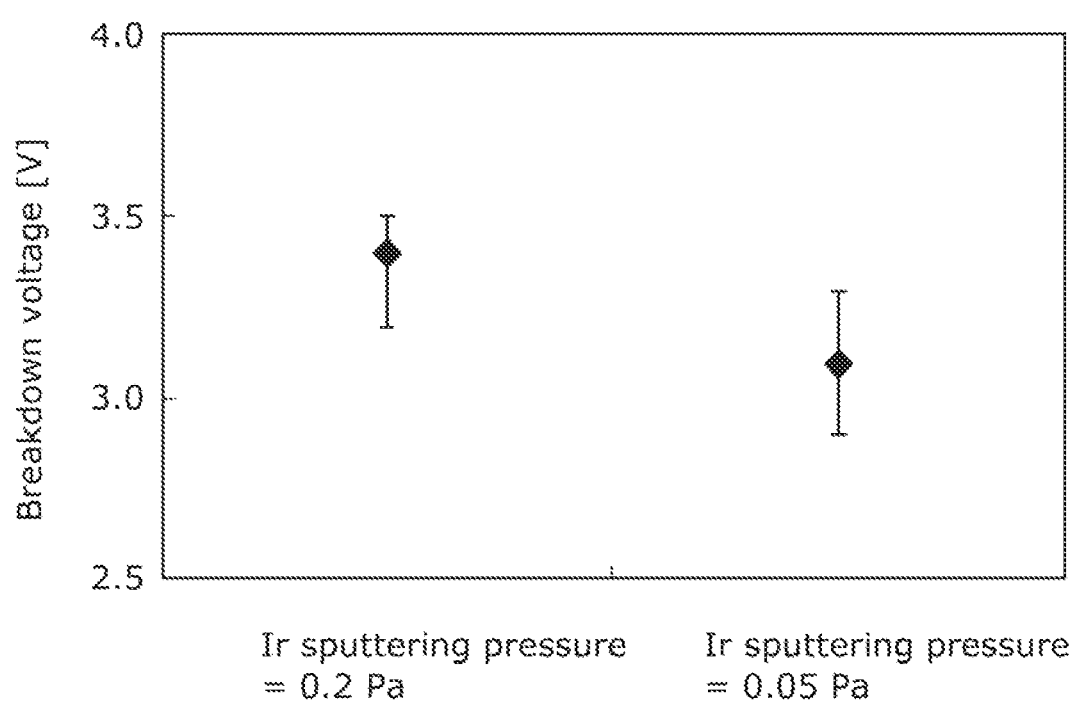
FIG. 7 is a graph which compares a breakdown voltage of the conventional nonvolatile semiconductor memory element and a breakdown voltage of the nonvolatile memory element according to Embodiment 1.

Here, FIG. 7 shows distribution of threshold voltages of the cases where the Ir sputtering pressure=0.2 [Pa] and the Ir sputtering pressure=0.05 [Pa]. As shown in FIG. 7, the sample with the Ir sputtering pressure=0.05 Pa has a reduced breakdown voltage compared to the sample with the Ir sputtering pressure=0.2 Pa.

The results described above indicate that the breakdown voltage can be reduced by setting the sputtering pressure for the Ir deposition to 0.05 [Pa] to form the Ta—Ta bond on $Ta_2O_5$.

Embodiment 2

A nonvolatile memory element according to the present invention and a method for manufacturing the nonvolatile memory element according to the present invention in Embodiment 2 are described with reference to FIG. 8 and FIG. 9.

A variable resistance element 113 of a nonvolatile memory device 30 according to Embodiment 2 is different from the variable resistance element 113 of the nonvolatile memory device 10 according to Embodiment 1 in that, in Embodiment 2, a metal-metal bonding region 107 is formed in a second variable resistance layers 106b and 106c. More specifically, in Embodiment 1, the metal-metal bonding region 107 is present at the interface between the second variable resistance layer 106b and the second electrode layer 108. In contrast, in Embodiment 2, a second variable resistance layer has two-layer structure of the layer 106b and the layer 106c, and the metal-metal bonding region 107 is present between the second variable resistance layers 106b and 106c.

(Configuration of a Variable Resistance Element)

First, a configuration of the nonvolatile memory element according to this embodiment is described. Here, FIG. 8 is a cross-sectional view showing an exemplary configuration of the nonvolatile memory device 30 including a nonvolatile memory element (the variable resistance element 113) according to this embodiment.

Figure 8:
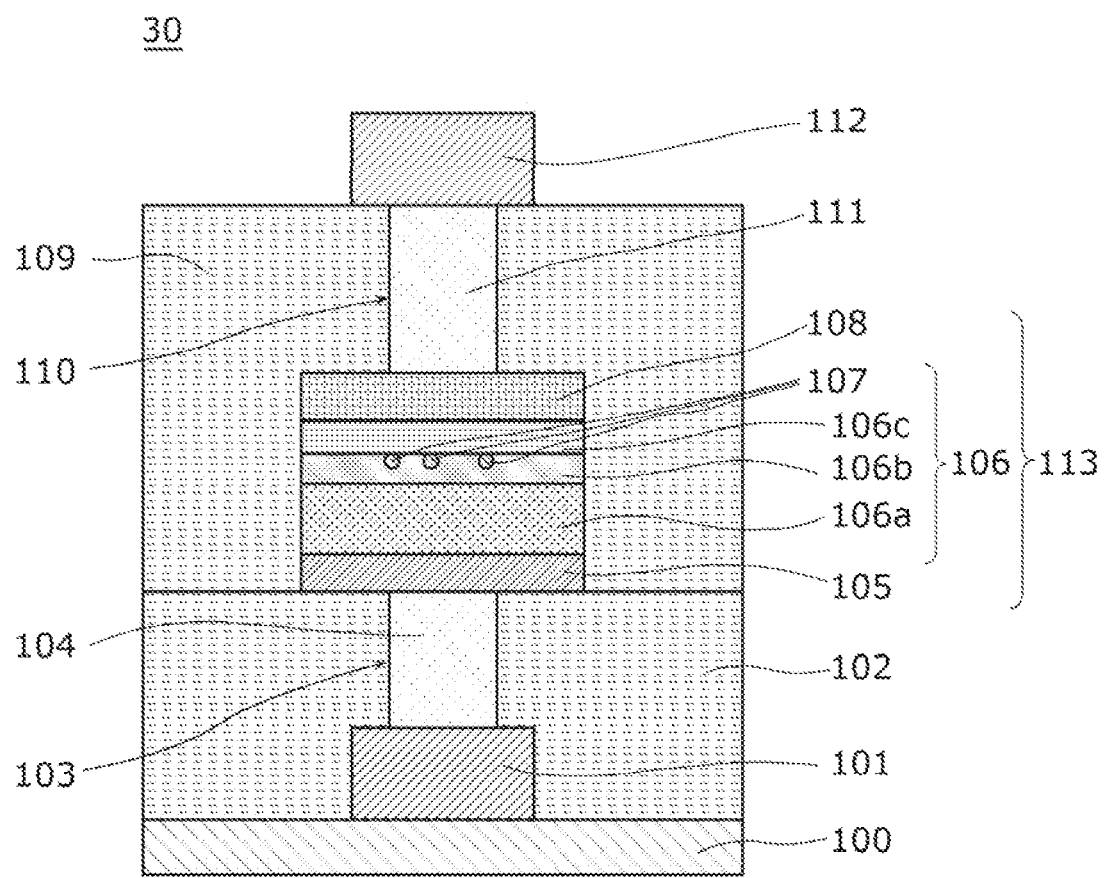
FIG. 8 is a cross-sectional view schematically showing an exemplary configuration of a nonvolatile memory device including a nonvolatile memory element according to Embodiment 2.

As shown in FIG. 8, the nonvolatile memory device 30 includes: a substrate 100; a first line 101; a first interlayer dielectric 102; a first contact plug 104 embedded in a first contact hole 103 formed in the first interlayer dielectric 102; a variable resistance element 113; a second interlayer dielectric 109 which covers the variable resistance element 113; a second contact plug 111 embedded in a second contact hole 110 formed in the second interlayer dielectric 109; and the second line 112 formed to cover the upper surface of the second contact plug 111.

Note that, as with Embodiment 1, the nonvolatile memory element according to the present invention includes the variable resistance element 113; and the substrate 100, the first line 101, the first interlayer dielectric 102, the first contact hole 103, the first contact plug 104, the second interlayer dielectric 109, the second contact hole 110, the second contact plug 111, and the second line 112 are not essential components of the present invention. Configurations, such as materials and shapes, of the substrate 100, the first line 101, the first interlayer dielectric 102, the first contact plug 104, the second interlayer dielectric 109, the second contact plug 111, and the second line 112 are the same as the configurations described in the above Embodiment 1.

The variable resistance element 113 according to this embodiment includes the first electrode layer 105, the first variable resistance layer 106a, the second variable resistance layers 106b and 106c in two-layer structure, and the second electrode layer 108 which are stacked in the stated order. The metal-metal bonding region 107 is present between the second variable resistance layers 106b and 106c. Note that, configurations, such as materials and shapes, of the first electrode layer 105 and the second electrode layer 108 are the same as the configurations described in the above Embodiment 1.

The first variable resistance layer 106a comprises, as with Embodiment 1 described above, an oxygen-deficient first metal oxide and has a film thickness of 5 to 100 [nm]. The first metal oxide may, as with Embodiment 1 described above, comprise a transition metal oxide or an aluminum oxide. More specifically, the first metal oxide may comprise at least one metal oxide selected from the group consisting of a tantalum oxide, a hafnium oxide, a zirconium oxide, an aluminum oxide, and the like. Hereinafter, as with Embodiment 1, description is given assuming the case in which $TaO_x$ is used as a first metal oxide. Here, x may satisfy: 0.8≤x≤1.9. Furthermore, the film thickness of the first variable resistance layer 106a is set appropriately according to manufacturing processing or a film thickness, a shape, or the like of another layer.

In this embodiment, the second variable resistance layers 106b and 106c are in two-layer structure. The second metal oxides included in the second variable resistance layer 106b and 106c comprise, in a similar manner as the second metal oxide in Embodiment 1, a metal oxide having a low degree of oxygen deficiency and a high resistance value compared to the first metal oxide included in the first variable resistance layer 106a. Furthermore, the second metal oxide may, as with Embodiment 1 described above, comprise a transition metal oxide or an aluminum oxide. More specifically, the second metal oxide may comprise, as with Embodiment 1, at least one metal oxide selected from the group consisting of a tantalum oxide, a hafnium oxide, a zirconium oxide, an aluminum oxide, and the like. Furthermore, the second metal oxide may comprise an oxide of the same metal as the first metal oxide or may comprise an oxide of a different metal from the first metal oxide. The following description is given assuming the case in which the second metal oxide included in the second variable resistance layer 106b is $TaO_{y1}$ and the second metal oxide included in the second variable resistance layer 106c is $TaO_{y2}$. In this case, as described above, this embodiment assumes that the metal oxide included in the first variable resistance layer 106a is $TaO_x$. Thus, x<y1, y2 may be satisfied. In addition, y1 and y2 may satisfy: 2.1≤y1, y2≤2.5. Note that, the second variable resistance layers 106b and 106c may include insulators. Furthermore, in this embodiment, the second variable resistance layers 106b and 106c have film thicknesses of 2 to 10 [nm]. Note that, the film thicknesses of the second variable resistance layers 106b and 106c are set appropriately according to manufacturing processing or a film thickness, a shape, or the like of another layer.

The metal-metal bonding region 107 is, as with Embodiment 1 described above, a region including a metal-metal bond in which metals included in the second metal oxide are bonded. The metal-metal bonding region 107 in this embodiment is formed between the second variable resistance layers 106b and 106c. As with the above-described Embodiment 1, the metal-metal bonding region 107 may be formed to be a layer having the same surface area as each of the second variable resistance layers 106b and 106c or may be formed to be partially present. Furthermore, the metal-metal bonding region 107 partially present between the second variable resistance layers 106b and 106c may include a plurality of discontinuous regions.

(Manufacturing Method)

Next, a method for manufacturing the nonvolatile memory element according to this embodiment is described.

The method for manufacturing the nonvolatile memory element according to this embodiment includes: a process of forming the first electrode layer 105, a process of forming, on the first electrode layer 105, the first variable resistance layer 106a comprising the first metal oxide; a process of forming, on the first variable resistance layer 106a, the second variable resistance layer 106b comprising the second metal oxide having a low degree of oxygen deficiency and a high resistance value compared to the first metal oxide; a process of forming, in the second variable resistance layer 106b, the metal-metal bonding region 107 including a metal bond of metal atoms included in the second metal oxide; and a process of forming, on the second variable resistance layer 106b, the second electrode layer 108. Note that, in this embodiment, the process of forming the second variable resistance layer 106b includes (i) a first stacking process of stacking the second metal oxide after the process of forming the first variable resistance layer 106a (ii) and a second stacking process of stacking the second metal oxide after the process of forming the metal-metal bonding region 107, and the process of forming the metal-metal bonding region 107 includes, after the first stacking process, stacking a third metal oxide having a higher degree of oxygen deficiency than the second metal oxide. The metal-metal bonding region is thus formed.

The following specifically describes a method for manufacturing the nonvolatile memory device 30 including the nonvolatile memory element according to the present invention.

Here, each of FIG. 9A to FIG. 9D is a schematic cross-sectional view showing a part (especially a process of forming the second variable resistance layer 106b to the process of forming the second electrode layer 108) of the method for manufacturing the nonvolatile memory device 30 shown in FIG. 8.

Figure 9A:
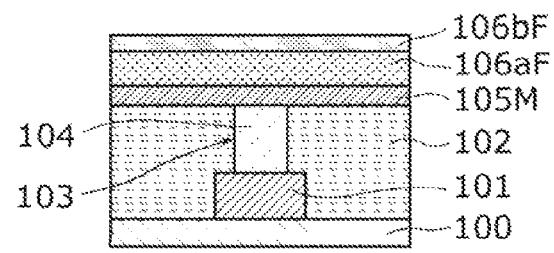
FIG. 9A is a cross-sectional view showing a process of forming, on the upper surface of a first metal oxide layer, a second metal oxide layer included in a second variable resistance layer, in a method for manufacturing the nonvolatile memory element according to Embodiment 2.
Figure 9B:
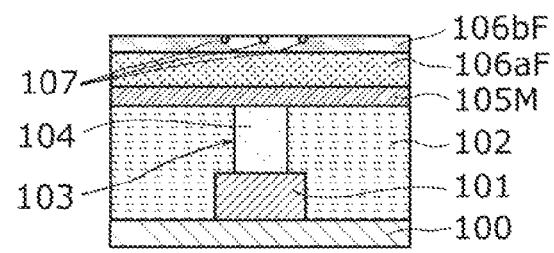
FIG. 9B is a cross-sectional view showing a process of forming a metal-metal bonding region according to Embodiment 2.
Figure 9C:
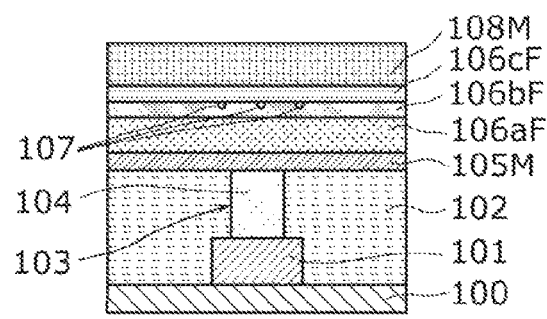
FIG. 9C is a cross-sectional view showing a process of forming, on the metal-metal bonding region, (i) the second metal oxide layer included in the second variable resistance layer and (ii) a second electrode material layer included in a second electrode layer according to Embodiment 2.
Figure 9D:
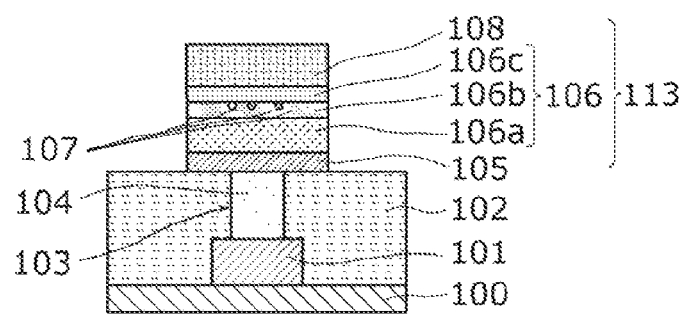
FIG. 9D is a cross-sectional view showing a process of forming a first electrode layer, a first variable resistance layer, the second variable resistance layer, and the second electrode layer by performing patterning on a first electrode material layer, the first metal oxide layer, the second metal oxide layer, and the second electrode material layer in Embodiment 2.

First, a process shown in FIG. 2A (the process of forming the first line 101) to a process shown in FIG. 2F (corresponding to the process of forming the first electrode layer and the process of forming the first variable resistance layer, together with the process of forming the first electrode material layer 105M and the first metal oxide layer 106aF and the patterning process shown in FIG. 9D). Note that, the processes shown in FIG. 2A to FIG. 2F are the same as the processes in the above-described Embodiment 1, and thus their descriptions are omitted.

After the first metal oxide layer 106aF shown in FIG. 2F is formed, as shown in FIG. 9A, the second metal oxide layer 106bF comprising the second metal oxide is formed on the first metal oxide layer 106aF (corresponding to the first stacking process of the process of forming the second variable resistance layer). The second metal oxide layer 106bF is formed, for example, with a plasma oxidation in which surface of the substrate, that is, a portion of the first metal oxide layer 106aF is treated, in a similar manner as the second metal oxide layer 106bF in Embodiment 1. The thickness of the second metal oxide layer 106bF may be, for example, 3 to 4 nm. Conditions for the plasma oxidation process are, for example, RF power source output of 50 [W], a substrate temperature of 270 [degree Celsius], and an $O_2$ flow rate of 0.3 [SLM].

With the plasma oxidation treatment performed under the above-described conditions, the second metal oxide layer 106bF is configured to have a composition ($TaO_{y1}$) near $Ta_2O_5$ (oxygen content atomic percentage=71.4%) that is an insulator. Here, an attempt is made to measure, using the four-terminal measurement technique, the resistivity of the second metal oxide layer 106bF obtained as a result of the plasma oxidation treatment under the above-described conditions. However, the resistivity is found to exceed the measurable upper limit ($10^8$ [Ω/sq.]). Therefore, the resistivity is believed to be at least $5×10^5$ [mΩ·cm] or greater.

Subsequently, as shown in FIG. 9B, the metal-metal bonding region 107 is formed (corresponding to the process of forming the metal-metal bonding region) on the second metal oxide layer 106bF. More specifically, for the formation, for example, a sputtering method is used in which tantalum is used as the target. The thickness of the metal-metal bonding region 107 may be 0.3 nm. Processing conditions of reactive sputtering is, for example, power source output of 1000 [W], a film formation pressure of 0.05 [Pa], and an argon flow rate of 20 [sccm].

Here, the sputtered film having a thickness of 50 nm formed under the same conditions as the metal-metal bonding region 107 is measured using the RBS method. The result shows that its composition (a value of z in $TaO_z$) is: z=1.78.

Hereinafter, the composition of the $TaO_z$ layer formed under the same conditions is denoted as $TaO_{1.78}$. Furthermore, the resistance value of the sample the same as the sample used for the composition analysis is measured using the four-terminal measurement technique, and its resistivity is observed to be 15 [mΩ·cm].

Subsequently, as shown in FIG. 9C, a layer 106cF comprising the second metal oxide is stacked on the second metal oxide layer 106bF and the metal-metal bonding region 107 (corresponding to the second stacking process in the process of forming the second variable resistance layer), and the second electrode material layer 108M included in the second electrode layer is deposited on the layer 106cF (corresponding to the process of forming the second electrode layer, together with the patterning process shown in FIG. 9D).

The second metal oxide layer 106cF is formed, for example, in a similar manner as the first metal oxide layer 106aF, by reactive sputtering in which tantalum is used as the target and the sputtering is performed in the atmosphere including oxygen. Conditions of the reactive sputtering is, for example, power source output of 1000 [W], a film formation pressure of 0.05 [Pa], an argon flow rate of 20 [sccm], and an oxygen gas flow rate of 21 [sccm]. Note that, the layer 106cF is configured to have a composition ($TaO_2$) having the oxygen content atomic percentage of 67 to 71 [atm %] close to $Ta_2O_5$ (oxygen content atomic percentage=71.4%) that is an insulator. Furthermore, the layer 106cF has a resistivity greater than or equal to $10^7$ [mΩ·cm] and a film thickness of 2 nm.

In this embodiment, the second electrode material layer 108M is formed by sputtering in which iridium (Ir) is deposited to have a thickness of 80 [nm], in a similar manner as the above-described Embodiment 1. The processing condition of the sputtering is, for example, a film formation pressure of 0.2 [Pa].

Subsequently, as shown in FIG. 9D, patterning is performed on the first electrode material layer 105M, the first metal oxide layer 106aF, the second metal oxide layer 106bF, the second metal oxide cF, and the second electrode material layer 108M to form the first electrode layer 105, the first variable resistance layer 106a, the second variable resistance layers 106b and 106c, and the second electrode layer 108. The patterning is performed, for example, using a desired mask and a dry etching technique. The variable resistance element 113 is thus formed.

After this, a process of forming the second interlayer dielectric 109 shown in FIG. 2K, a process of forming the second contact hole 110, the second contact plug 111, and the second line 112 shown in FIG. 2L are performed. The nonvolatile memory device 30 shown in FIG. 8 is thus formed. Note that, the process of forming the second interlayer dielectric 109 shown in FIG. 2K, the process of forming the second contact hole 110, the second contact plug 111, and the second line 112 shown in FIG. 2L are the same as the processes in the above-described Embodiment 1, and thus their descriptions are omitted.

With the above-described configuration, in a similar manner as Embodiment 1, the Ta—Ta bond can be formed in $Ta_2O_5$ included in the second variable resistance layer. Thus, it becomes possible to reduce the breakdown voltage.

Another Embodiment (1) In the above-described Embodiment 1 and Embodiment 2, descriptions are given assuming that materials included in the first metal oxide, the second metal oxide, and the metal-metal bonding region are metal oxide materials which include tantalum, hafnium, zirconium, or aluminum. However, the materials are not limited to the above but may include titanium, for example.

(1-1) Note that, when hafnium oxides are used as the first metal oxide and the second metal oxide, $0.9 \leq x \leq 1.6$, and $1.8 < y < 2.0$ may be satisfied where the composition of the first metal oxide is denoted as $HfO_x$ and the composition of the second metal oxide is denoted as $HfO_y$.

In this case, the first metal oxide layer 106aF (the first hafnium oxide layer) comprising a hafnium oxide may be formed, for example, by reactive sputtering in which Hf is used as the target and sputtering is performed in an argon gas and oxygen gas.

The second metal oxide layer 106bF (the second hafnium oxide layer) comprising the hafnium oxide can be formed, for example, by exposing the surface of the first hafnium oxide layer 106aF to plasma of an argon gas and an oxygen gas. The oxygen content atomic percentage of the first hafnium oxide layer 106aF can be adjusted easily, in a similar manner as the case of the tantalum oxide described above, by changing the flow rate of the oxygen gas with respect to the argon gas in the reactive sputtering. Note that, the substrate need not be specially heated and may be at room temperature. Moreover, the film thickness of the second hafnium oxide layer 106bF can be adjusted easily by changing the exposure time to the plasma of the argon gas and the oxygen gas. The film thickness of the second hafnium oxide layer 106bF may be no less than 3 nm and no more than 4 nm.

When the second metal oxide comprises the hafnium oxide, the metal-metal bonding region 107 is a region including Hf—Hf bond.

(1-2) Furthermore, when the first metal oxide and the second metal oxide comprise zirconium oxides, $0.9 \leq x \leq 1.4$, and $1.9 < y < 2.0$ may be satisfied where the composition of the first metal oxide is denoted as $ZrO_x$ and the composition of the second metal oxide is denoted as $ZrO_y$.

In this case, the first metal oxide layer 106a (a first zirconium oxide layer) comprising the zirconium oxide can be formed, for example, by reactive sputtering in which Zr is used as the target and sputtering is performed in an argon gas and an oxygen gas.

A second metal oxide layer 106bF (a second zirconium oxide layer) comprising a zirconium oxide can be formed, for example, by exposing the surface of a first zirconium oxide layer 106aF to plasma of an argon gas and an oxygen gas. The oxygen content atomic percentage of the first zirconium oxide layer 106aF can be easily adjusted, in a similar manner as the case of the tantalum oxide described above, by changing the flow rate of the oxygen gas with respect to the argon gas in the reactive sputtering. Note that, the substrate need not be specially heated and may be at room temperature. Moreover, the film thickness of the second zirconium oxide layer 106bF can be adjusted easily by changing the exposure time to the plasma of the argon gas and the oxygen gas. The film thickness of the second zirconium oxide layer 106bF may be no less than 1 nm and no more than 5 nm.

When the second metal oxide comprises a zirconium oxide, the metal-metal bonding region 107 is a region including a Zr—Zr bond.

Note that, the above-described hafnium oxide layer and the zirconium oxide layer can be formed using a CVD method or an atomic layer deposition (ALD) method, instead of by sputtering.

(1-3) The first metal included in the first metal oxide and the second metal included in the second metal oxide may be different metals. In this case, the second variable resistance layer 106b comprising the second metal oxide may have a low degree of oxygen deficiency, that is, have high resistance compared to the first variable resistance layer 106a comprising the first metal oxide. With this configuration, a voltage applied between the first electrode layer 105 and the second electrode layer 108 at the time of a resistance change is distributed more to the second variable resistance layer 106b, so that it is possible to facilitate the oxidation-reduction reaction which occurs in the second variable resistance layer 106b.

Furthermore, when the first metal and the second metal comprise mutually different materials, the second metal may have a standard electrode potential lower than the standard electrode potential of the first metal. This is because it is believed that an oxidation-reduction reaction occurs in a small filament (conductive path) formed in the second variable resistance layer 106b having high resistance, causing a change in the resistance value of the second variable resistance layer 106b, and the resistance changing phenomenon thus occurs. A stable resistance changing operation is achieved, for example, when the first variable resistance layer 106a comprises an oxygen-deficient tantalum oxide and the second variable resistance layer 106b comprises a titanium oxide ($TiO_2$). Titanium (standard electrode potential=−1.63 eV) is a material having a lower standard electrode potential than tantalum (standard electrode potential=−0.6 eV). The higher the standard electrode potential of a material is, the more difficult it is to oxidize the material. When an oxide of a metal having a lower standard electrode potential than the first variable resistance layer 106a is provided in the second variable resistance layer 106b, occurrence of the oxidation-reduction reaction is more facilitated in the second variable resistance layer 106b. As another combination, for example, the first variable resistance layer 106a may comprise an oxygen-deficient tantalum oxide ($TaO_x$), and the second variable resistance layer 106b may comprise an aluminum oxide ($Al_2O_3$).

Note that, as described earlier, the resistance change phenomenon in the variable resistance layer comprising an oxygen-deficient metal oxide occurs due to transfer of oxygen, and thus the type of constituent metal may be different, as long as, at least, the transfer of oxygen is possible. Thus, it is believed that, even when the first metal included in the first variable resistance layer 106a and the second metal included in the second variable resistance layer 106b are different metals, advantageous effects similar to the case of using the same metal are produced.

(2) In addition, it is sufficient that the first variable resistance layer 106a and the second variable resistance layer 106b include, as a primary variable resistance layer which causes a change in resistance, oxide layers of tantalum, hafnium, zirconium, or the like. Other than the above, for example, a small amount of other elements may be contained. It is also possible to add a small amount of other elements on purpose, for example, to achieve fine control of a resistance value, which is also included in the scope of the present invention. For example, adding nitrogen to a variable resistance layer increases the resistance value of the variable resistance layer, so that the sensitivity of resistance change is increased.

Thus, when the variable resistance element includes the variable resistance layer comprising an oxygen-deficient metal oxide M, and the variable resistance layer has a structure including (i) the first variable resistance layer comprising an oxygen-deficient first metal oxide of a composition denoted as $MO_x$ (where $0 \leq x \leq 2.5$) and (ii) the second variable resistance layer comprising an oxygen-deficient second metal oxide of a composition denoted as $MO_y$ (where $x<y \leq 2.5$), the first variable resistance layer and the second variable resistance layer may include, in addition to the metal oxides of corresponding compositions, predetermined impurities (e.g. an additive for controlling the resistance value).

Furthermore, there may be the case where a small amount of an element may be unintentionally mixed into a resistance film due to, for example, residual gas or gas released from the wall of a vacuum chamber when the resistance film is formed by sputtering. Such a case where a small amount of an element is mixed into the resistance film is also within the scope of the present invention as a matter of course.

Although the nonvolatile element (the variable resistance element) according to the present invention and its manufacturing method has been described thus far based on the embodiments, the present invention is not limited: to these embodiments. The variable resistance nonvolatile element and its manufacturing method resulting from various modifications of the embodiments as well as embodiments resulting from any combinations of components of the embodiments that may be conceived by those skilled in the art are also intended to be included within the scope of the present invention as long as they do not depart from the essence of the present invention.

INDUSTRIAL APPLICABILITY

The nonvolatile memory element according to the present invention is useful as a nonvolatile memory element including a variable resistance layer that includes metal oxide layers which have different degrees of oxygen deficiency and are stacked, and particularly useful as a nonvolatile memory element which can reduce a breakdown voltage.

REFERENCE SIGNS LIST

10 Nonvolatile memory device
20 Nonvolatile memory device
30 Nonvolatile memory device
100 Substrate
101 First line
102 First interlayer dielectric
103 First contact hole
104 First contact plug
104M Conductive material layer
105 First electrode layer
105M First electrode material layer
106 Variable resistance layer
106a First variable resistance layer
106aF First metal oxide layer
106b Second variable resistance layer
106bF Second metal oxide layer
106c Second variable resistance layer
106cF Second metal oxide layer
107 Metal-metal bonding region
108 Second electrode layer
108M Second electrode material layer
109 Second interlayer dielectric
110 Second contact hole
111 Second contact plug
112 Second line
113 Variable resistance element
200 Substrate
201 First line
202 First interlayer dielectric
203 First contact hole
204 First contact plug
205 First electrode layer
206 Variable resistance layer 206a First tantalum oxide layer
206b Second tantalum oxide layer
207 Second electrode layer
208 Second interlayer dielectric
209 Second contact hole
210 Second contact plug
211 Second line
212 Variable resistance element

The invention claimed is:

1. A nonvolatile memory element comprising:
a first electrode;
a second electrode; and
a variable resistance layer which is positioned between the first electrode and the second electrode, the variable resistance layer having a resistance state which is configured to reversibly change based on an electrical signal applied between the first electrode and the second electrode,
wherein the variable resistance layer includes a first variable resistance layer comprising a first metal oxide and a second variable resistance layer comprising a second metal oxide, and the second variable resistance layer includes a metal-metal bonding region including a metal bond of metal atoms included in the second metal oxide, the second metal oxide having a low degree of oxygen deficiency and a high resistance value compared to the first metal oxide.

2. The nonvolatile memory element according to claim 1, wherein in the variable resistance layer, the metal-metal bonding region is present at an interface between the second electrode and the second variable resistance layer.

3. The nonvolatile memory element according to claim 1, wherein in the variable resistance layer, the metal-metal bonding region is present in the second variable resistance layer except on a surface of the second variable resistance layer.

4. The nonvolatile memory element according to claim 1, wherein the metal-metal bonding region is present in the second variable resistance layer near an interface between the second variable resistance layer and the second electrode, and
the second variable resistance layer has a degree of oxygen deficiency which gradually increases toward the second electrode.

5. The nonvolatile memory element according to claim 1, wherein each of the first metal oxide, the second metal oxide, and the metal-metal bonding region comprises a transition metal oxide or an aluminum oxide.

6. The nonvolatile memory element according to claim 1, wherein the first metal oxide, the second metal oxide, and the metal-metal bonding region comprise a material including tantalum, hathium, or zirconium.

7. The nonvolatile memory element according to claim 1, wherein the second variable resistance layer comprises an insulator.

8. A method for manufacturing a nonvolatile memory element, comprising:
forming a first electrode layer;
forming, on the first electrode layer, a first variable resistance layer comprising a first metal oxide;
forming, on the first variable resistance layer, a second variable resistance layer which comprises a second metal oxide having a low degree of oxygen deficiency and a high resistance value compared to the first metal oxide;
forming, in the second variable resistance layer, a metal-metal bonding region including a metal bond of metal atoms included in the second metal oxide; and
forming a second electrode layer on the second variable resistance layer.

9. The method for manufacturing a nonvolatile memory element according to claim 8,
wherein in the forming of a metal-metal bonding region, oxygen is desorbed from the second variable resistance layer to form the metal-metal bonding region.

10. The method for manufacturing a nonvolatile memory element according to claim 9,
wherein in the forming of a second electrode layer, the second electrode layer is formed by sputtering, and
in the forming of a metal-metal bonding region, sputtering is performed using, as a target, a second electrode material included in the second electrode layer, with a film formation pressure lower than a film formation pressure for forming the second electrode layer.

11. The method for manufacturing a nonvolatile memory element according to claim 8,
wherein the forming of a second variable resistance layer includes (i) stacking the second metal oxide after the forming of a first variable resistance layer and (ii) stacking the second metal oxide after the forming of a metal-metal bonding region.

* * * * *